(12) United States Patent  
Tyamgondlu et al.

(10) Patent No.: US 12,342,034 B2  
(45) Date of Patent: Jun. 24, 2025

(54) MULTI-DISPLAY VIDEO SYNCHRONIZATION

(71) Applicant: Intel Corporation, Santa Clara, CA (US)

(72) Inventors: Karthik Tyamgondlu, Chandler, AZ (US); Benjamin Thomas Cope, Loudwater (GB); Satyeshwar Singh, Folsom, CA (US); Sangeeta Ghangam Manepalli, Chandler, AZ (US); Aswin Padmanabhan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 674 days.

(21) Appl. No.: 17/556,497

(22) Filed: Dec. 20, 2021

(65) Prior Publication Data

US 2022/0116678 A1   Apr. 14, 2022

(51) Int. Cl.
| | |
|---|---|
| *H04N 5/45* | (2011.01) |
| *G09G 3/36* | (2006.01) |
| *H03L 7/08* | (2006.01) |
| *H04N 21/43* | (2011.01) |

(52) U.S. Cl.
CPC ......... *H04N 21/43076* (2020.08); *H03L 7/08* (2013.01); *H04N 21/4305* (2013.01)

(58) Field of Classification Search
None
See application file for complete search history.

(56) References Cited

U.S. PATENT DOCUMENTS

2018/0286333 A1* 10/2018 Inoue .................... G09G 5/006

* cited by examiner

*Primary Examiner* — Carl Adams  
(74) *Attorney, Agent, or Firm* — Alliance IP, LLC

(57) ABSTRACT

In one embodiment, video content displayed across a plurality of display devices is synchronized by first obtaining a first set of VSYNC timestamps for a display controller of a first video display device and a second set of VSYNC timestamps for a display controller of a second video display device. An adjustment factor is determined based on a comparison of the first and second VSYNC timestamps, and an adjusted VSYNC period for the display controller of the second video display device is programmed based on the determined adjustment factor. After a predetermined number of VSYNC cycles, the display controller of the second video display device reverts back to an original VSYNC period.

25 Claims, 12 Drawing Sheets

MULTI-DISPLAY VIDEO SYNCHRONIZATION

FIELD OF THE SPECIFICATION

This disclosure relates in general to the field of video processing and playback, and more particularly, though not exclusively, to video synchronization across multiple displays.

BACKGROUND

Digital signage for displaying video content, such as video advertisements, is often implemented as a video wall. A video wall typically includes a collection of display devices that each display a different portion of the overall video content. The video content is collectively generated by one or more computing devices, each of which generates video content for one or more of the displays. Moreover, the video content must be synchronized across all of the displays. Otherwise, it may appear distorted or out of sync to a human observer, which negatively impacts the user experience. It can be challenging, however, to synchronize video content across multiple displays with a high degree of precision, particularly for video walls implemented across numerous displays and associated computing devices.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

EMBODIMENTS OF THE DISCLOSURE

Figure 1A:
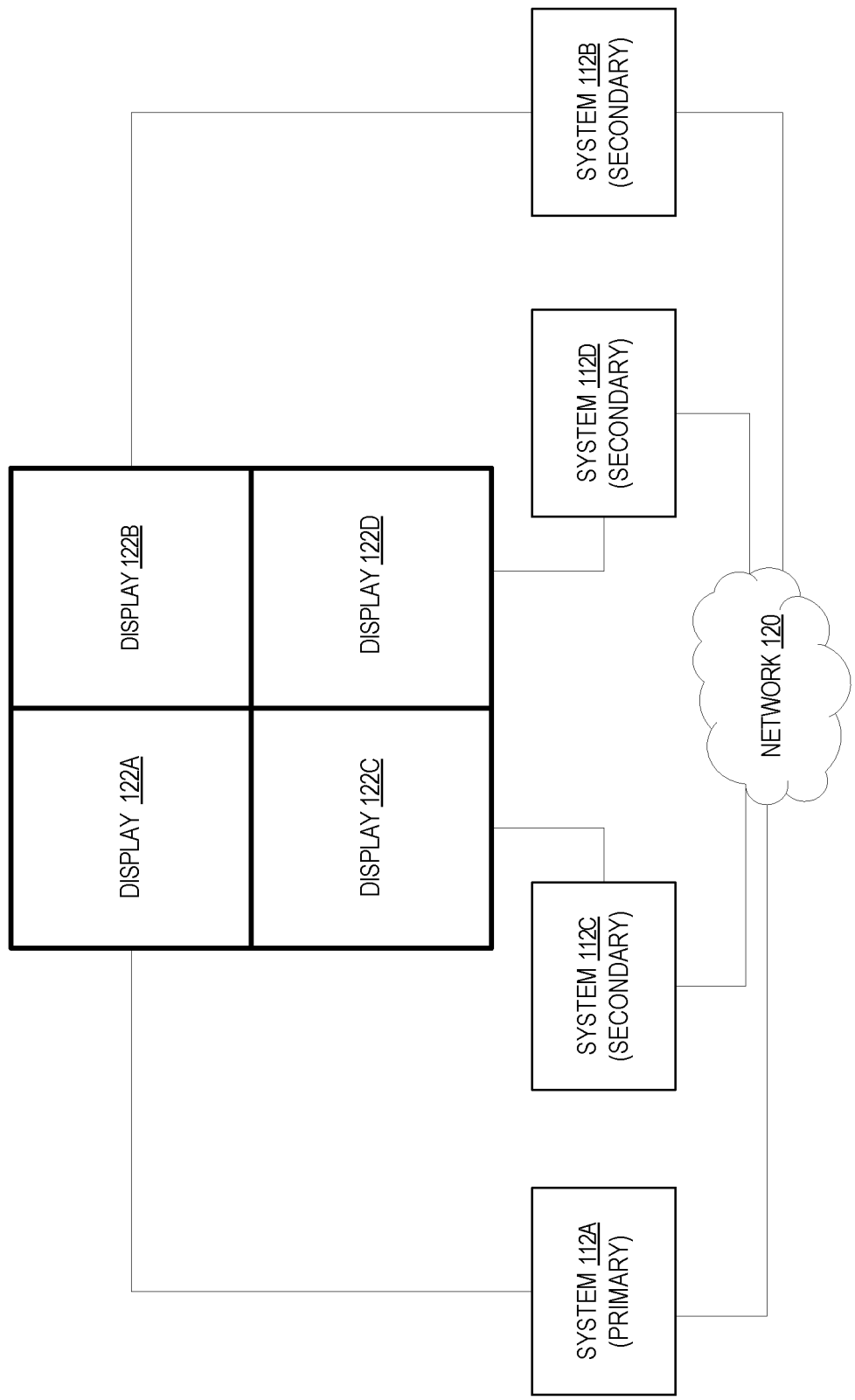
FIGS. 1A-1B illustrate example multi-display systems in accordance with embodiments of the present disclosure.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

Multi-Display Video Synchronization

Video walls and other types of multi-display digital signage are used to present unified visual content across multiple synchronized displays—such as video advertisements—and are being increasingly used in public spaces, such as retail establishments, airports, and so forth. A video wall typically includes an arrangement of multiple displays (e.g., televisions, monitors, displays, screens), each of which displays a different portion of the overall video content. For example, the displays may be tiled together to form one large screen, or the displays may be arranged in a creative or artistic manner. Moreover, the video content displayed on a video wall must be synchronized across all displays; otherwise, the video content will appear distorted or out of sync to a human observer, which negatively impacts the user experience.

Previous software-based solutions provide a low degree of synchronization accuracy and require a lot of manual intervention. Further, they may be limited by the number of displays that can be synchronized at a time. Hardware-based solutions have provided accurate synchronization; however, these solutions have been limited to a particular number of displays (e.g., only up to 16) that can be synchronized. In addition, hardware-based solutions add to material costs, requiring coaxial or other types or hardware connectors, may require specific hardware component versions/generations to function properly, and may be spatially limited as there is often a need for all the display systems to be co-located based on the length of the connecting cables.

Accordingly, this disclosure presents embodiments that provide video synchronization across multiple displays in a multi-display system without a real limit on the number of displays that can be synchronized. Embodiments may utilize a combination of software and hardware techniques to achieve accurate synchronization between the various displays.

In particular embodiments, for example, a common time reference may first be established among the different displays, e.g., using IEEE 1588/precision time protocol (PTP), network time protocol (NTP), or another type of synchronization protocol (e.g., a proprietary protocol). One of the display systems in the sync-network is then designated as a primary system and broadcasts its frame flip/vertical synchronization (VSYNC) timestamps across the network (wired or wirelessly) to the other display systems, which are designated as secondary systems. The secondary systems may then synchronize their frame-flip/VSYNC timing with that of the primary system by computing a delta in the frame flip/VSYNC timestamps of the primary system and the frame flip/VSYNC timestamps of the secondary system. Based on the computed delta, the secondary system can modify a VSYNC period timing, e.g., by modifying an integer and/or fractional divider of the display clocks (e.g., DPLLs) to either speed up or slow-down their clocks dynamically. The adjusted timing allows the secondary system VSYNC timing to eventually, after a certain number of cycles, to fall in line with the primary system, at which point, the secondary system may revert back to an original/default VSYNC period timing.

In this way, multi-display synchronization can be scaled to a large number of systems/screens (e.g., 250+), as the only real requirement is that these systems are part of a wired or wireless synchronization network (e.g., based on IEEE1588 or using a network sync like NTP). In addition, aspects of the present disclosure may be scalable to multiple platforms, and if the display PLL logic doesn't change, it may also be applicable to future designs/systems as well. Furthermore, the synchronization accuracy of certain embodiments herein may be relatively high (e.g., within a few 100-pixel clocks) since such embodiments may involve modification of the system's Pixel clock frequencies.

Another benefit of the techniques described herein is that the adjustments are made at runtime (i.e., while displays may be displaying video/images), so the display systems and pipeline don't need to be switched off and back on in order for the changes to take effect. In fact, users may be unaware of any changes being made as they can happen behind the scenes and in a marginal manner.

Moreover, the techniques described herein may provide a cost-effective solution as existing capabilities of the systems are used. For instance, no special cables are needed to synchronize multiple systems as with current hardware synchronization mechanisms, and no spatial restrictions are present with this invention (e.g., display systems can be connected wirelessly or over a larger/wider area network). Additionally, the techniques herein don't impose any restriction on the display systems, e.g., that they all be alike in display IP/hardware generation, so disparate display systems can be controlled equally well with embodiments herein.

FIG. 1A illustrates an example multi-display system 100 in accordance with embodiments of the present disclosure. The example system 100 includes four displays 122A-D that are controlled by respective systems 112A-D, which are in turn coupled to one another by a network 120. The network 120 may be a wired or wireless network, and the systems 112 may communicate with one another using any suitable network-based synchronization protocols, e.g., IEEE 1588. In other embodiments, the systems 112 may be directly connected with one another, e.g., in a daisy chain configuration. In some embodiments, additional systems similar to the systems 112 and/or displays similar to the displays 122 may be coupled via the network 120, e.g., another multi-display system similar to 100 in a different location. All of the systems in the various embodiments described may maintain display synchronization according to the techniques described herein, e.g., according to the operations shown in FIG. 2.

In the example shown, the system 112A is designated as the primary display system, while the systems 112B-D are designated as secondary display systems. As described above, the system 112A may provide a reference timer signal to the secondary systems 112B-D, so that the secondary systems can synchronize their control or and images displayed on their connected displays 122B-D. In certain embodiments, for instance, the primary system 112A may provide a number of VSYNC timestamps to the secondary systems 112B-D, which can then compute a delta in their own VSYNC timestamps relative to the VSYNC timestamps of the primary system 112A. Based on the computed delta, the secondary system can increase or decrease a VSYNC period for its connected display, allowing the display's VSYNC timing to align with that of the primary system. Once aligned/synchronized, the secondary system can revert the VSYNC period to an original or default state (which may be the same or substantially the same as that of the primary system). This process can be repeated on demand or periodically by the secondary systems, and can be done at run time, i.e., while the displays are currently displaying images/video. The changes in the VSYNC period may be chosen to be relatively small so that there is no perceptible difference to an end viewer of the displays.

Figure 1B:
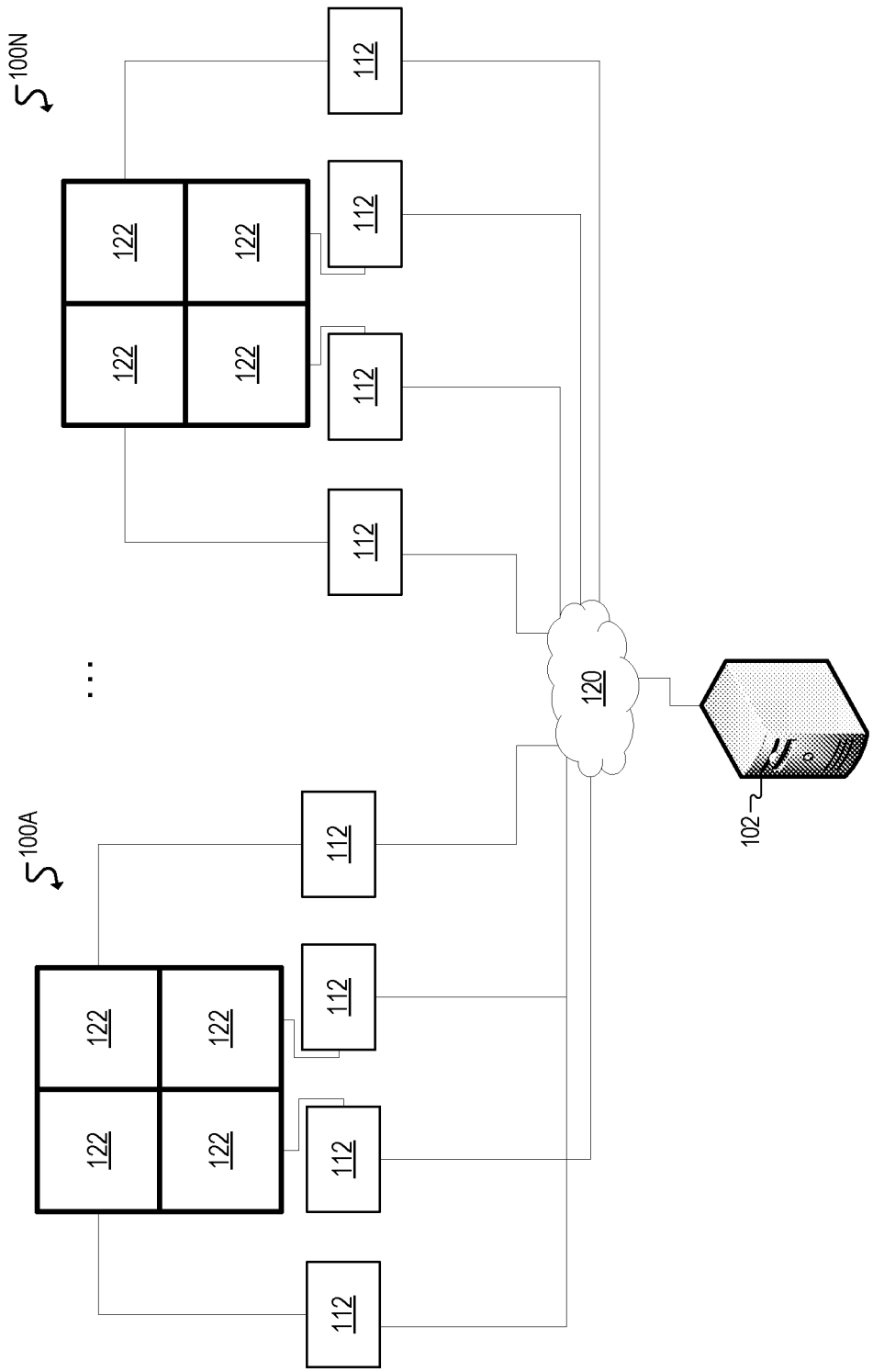

In some embodiments, a number of multi-display systems 100A-N may be connected together via a network 120 (e.g., an edge network as described further below) as shown in FIG. 1B. For example, in some use cases, multiple systems 100A-N may be physically separate video walls used to display the same video content, such as separate video walls on opposite sides of a large venue (e.g., a stadium or arena). In some embodiments, one of the systems 112 connected to a display 122 within system 100A may be designated as a primary system as described herein to synchronize video displayed on each of the other systems (e.g., 100N).

In some embodiments, a server (e.g., 102) connected to the network 120 may provide content for display on each of the multi-display systems 100A-N. The server 102 may pre-process content before sending it to the multiple systems 100A-N, where the synchronization is handled within the systems 100A-N as described herein. Pre-processing the content may include adding metadata such as region of interest (ROI) per multiple system, start time for each multiple system, and/or encoding. In certain embodiments, the server 102 may serve as the primary system as disclosed herein rather than a device of the systems 100. In this way, the server 102 may synchronize video across all of the systems 100A-N.

Although shown as one network 120 in FIG. 1B, it will be understood that the network 120 of FIG. 1B may include multiple sub-networks, e.g., a local wired (e.g., a local area network (LAN)) or wireless network (e.g., a personal area network (PAN)) within each of the systems 100 that is connected to a larger network (e.g., a wide area network (WAN) or the Internet) that connects the sub-networks together. Moreover, in some embodiments, the server 102 may be a virtualized instance of a system (e.g., a virtual machine) running on underlying server hardware.

Figure 2:
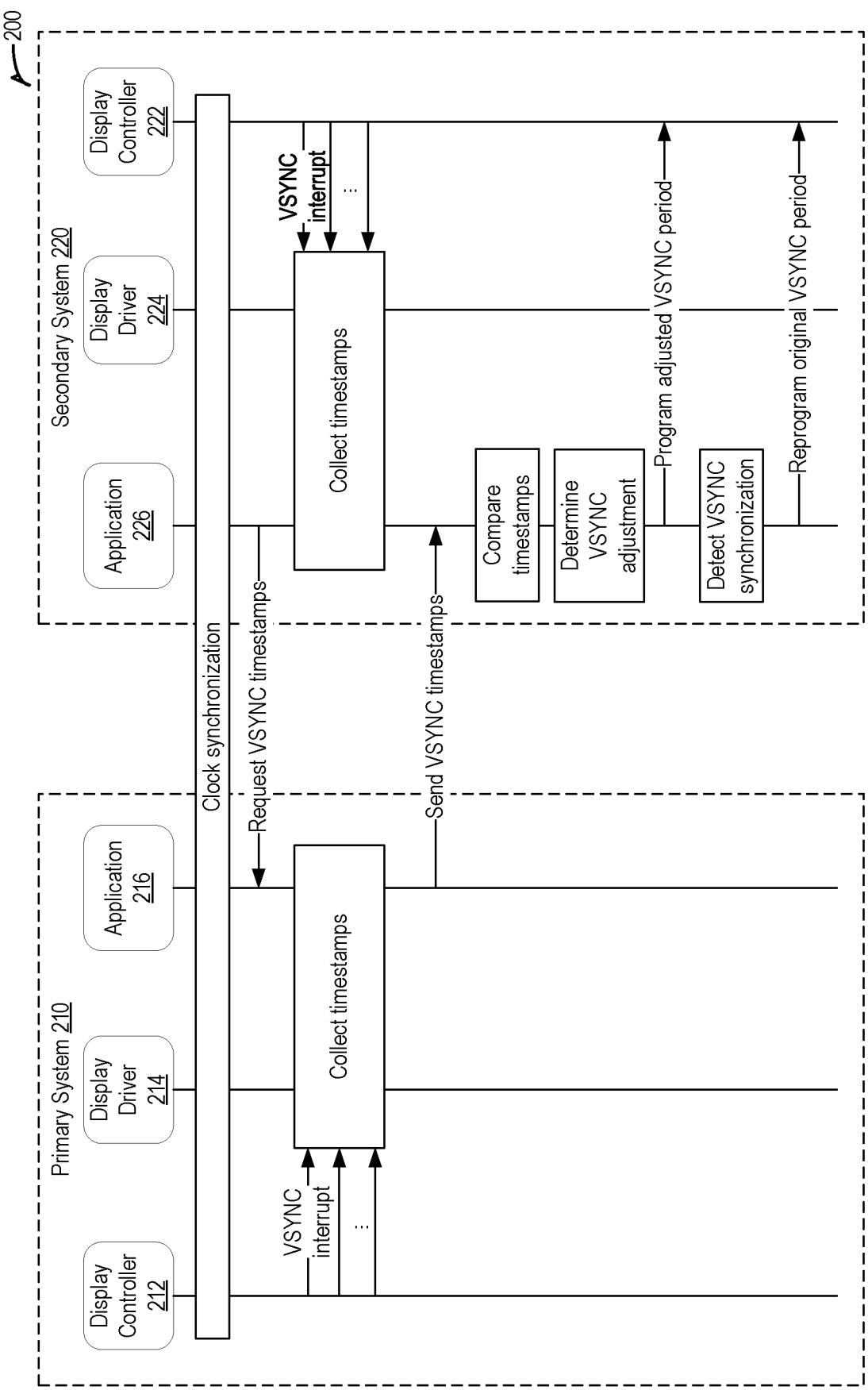
FIG. 2 illustrates an example sequence diagram for synchronizing a secondary display system with a primary display system in accordance with embodiments of the present disclosure.

FIG. 2 illustrates an example sequence diagram 200 for synchronizing a secondary display system with a primary display system in accordance with embodiments of the present disclosure. In the example shown, there is a primary system 210 and a secondary system 220 that is synchronized based on timings of the primary system 210. Although a single secondary system 220 is shown in FIG. 2, it will be understood that multiple additional secondary systems (configured in a similar manner as the secondary system 220) may perform similar operations as those shown in FIG. 2 as the secondary system 220 to synchronize with the primary system 210. The multiple secondary systems may perform their synchronization operations at the same time as one another, during overlapping times, or at completely different times.

The primary system 210 includes a display controller 212 that represents a hardware controller of a display panel coupled to the primary system 210, a display driver 214 that represents a software driver on the primary system 210 that controls the display controller 212, and an application 216 that represents a software application running on the primary system 210 that generates or otherwise provides image/video data for display on the display panel coupled to the primary system 210. Similarly, the secondary system includes a display controller 222 that represents a hardware controller of a display panel coupled to the secondary system 220, a display driver 224 that represents a software driver on the secondary system 220 that controls the display controller 222, and an application 226 that represents a software application running on the secondary system 220 that generates or otherwise provides image/video data for display on the display panel coupled to the secondary system 220.

Figure 5A:
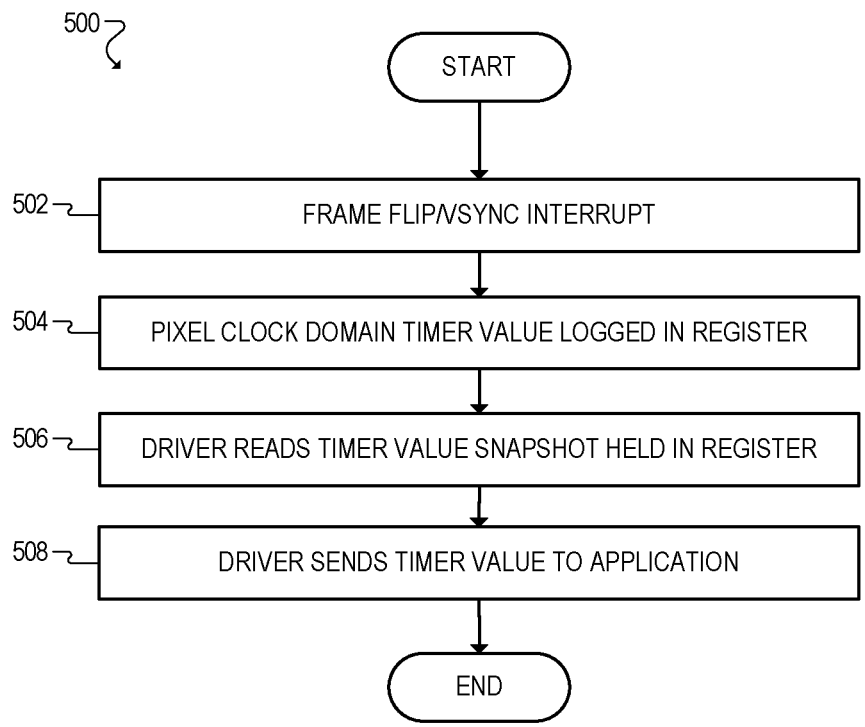
FIG. 5A-5B illustrate flowcharts for obtaining VSYNC timestamp values for synchronizing video across multiple displays in accordance with certain embodiments.
Figure 5B:
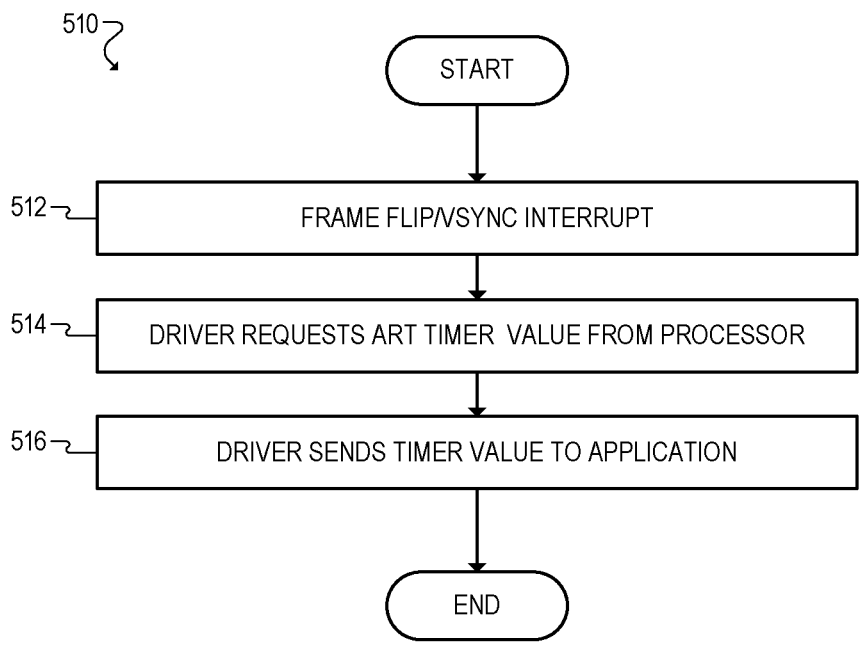

In the example sequence shown, the systems 210, 220 first perform a clock synchronization. The clock synchronization may be one specified by a network-based synchronization protocol, e.g., IEEE 1588, or another type of synchronization protocol. At some point in time, the application 226 of the secondary system 220 initiates a process (e.g., a software process) that requests a set of VSYNC timestamps from the application 216 of the primary system 210. In response, the application 216 and display driver 214 collect the requested set of timestamps by observing timer values corresponding to VSYNC interrupts asserted by the display controller 212 every time a frame flip/VSYNC occurs. FIGS. 5A-5B illustrate example processes in which the driver 214 may obtain the timestamps. The set of timestamps may include any suitable number of timestamps that can be used reliably to predict an average VSYNC duration for the primary system. For instance, in some embodiments, the set may include at least 50, e.g., 60 or 100 timestamps. Once the VSYNC timestamps have been collected by the application 216 on the primary system 210, they are sent to the application 226 of the secondary system 220. In other embodiments, the timestamps may be generated and sent to the secondary system as they are received rather than as a set as shown in FIG. 2.

In the meantime, the application 226 and display driver 224 collect a set of VSYNC timestamps by observing timer values corresponding to VSYNC interrupts asserted by the display controller 222 of the secondary system 220 every time a frame flip/VSYNC occurs. FIGS. 5A-5B illustrate example processes in which the driver 224 may obtain the timestamps. The set of timestamps may include any suitable number of timestamps that can be used reliably to predict an average VSYNC duration for the secondary system, and the number of timestamps collected may be the same as that for the primary system. Although shown as occurring at a similar time as the collection of timestamps by the primary system 210, the collection of timestamps at the secondary system 220 may occur at a different time, e.g., after the timestamps have been received from the primary system 210.

Once both sets of VSYNC timestamps have been collected by the application 226 on the secondary system 220, they are compared with one another to determine a delta between the timestamps. For example, in some embodiments, the application 226 may determine an average VSYNC period (the time between each asserted VSYNC signal) for the set of timestamps of the primary system and an average VSYNC period for the set of timestamps of the secondary system.

Based on the determined delta between the timestamps of the primary system 210 and the timestamps of the secondary system 220, the application 226 determines a VSYNC adjustment to apply. The VSYNC adjustment may be an adjustment to the VSYNC period of the secondary system 220, and may adjust the VSYNC period of the secondary system display to be shorter or longer (based on whether the secondary system display is lagging or leading the primary system display, respectively) than a current VSYNC period such that the VSYNC signal timing may change cycle over cycle to be more closely in alignment with the VSYNC signal timing of the primary system 210. In some instances, the determined adjustment may be relatively low, e.g., in the range of +/−0.01% to 0.5%, to avoid negative effects on the displayed images or avoid perceptible changes to a viewer of the display. In other instances, however, e.g., where the display can better handle large changes to the VSYNC period (or where disruption of the display output is permitted), the determined adjustment may be upwards of +/−2 to 5%, or larger. The determined VSYNC adjustment is then programmed in the display controller 222, e.g., by modifying an integer and/or fractional divider of the display's clock circuitry (e.g., DPLLs). After a number of VSYNC cycles/signals, which may be a known number of cycles/signals based on the determined VSYNC adjustment, the application 226 detects VSYNC synchronization by the secondary system 220 with the primary system 210, and then reprograms the display controller 222 to revert back to the prior (e.g., original or default) VSYNC period timing.

Figure 3:
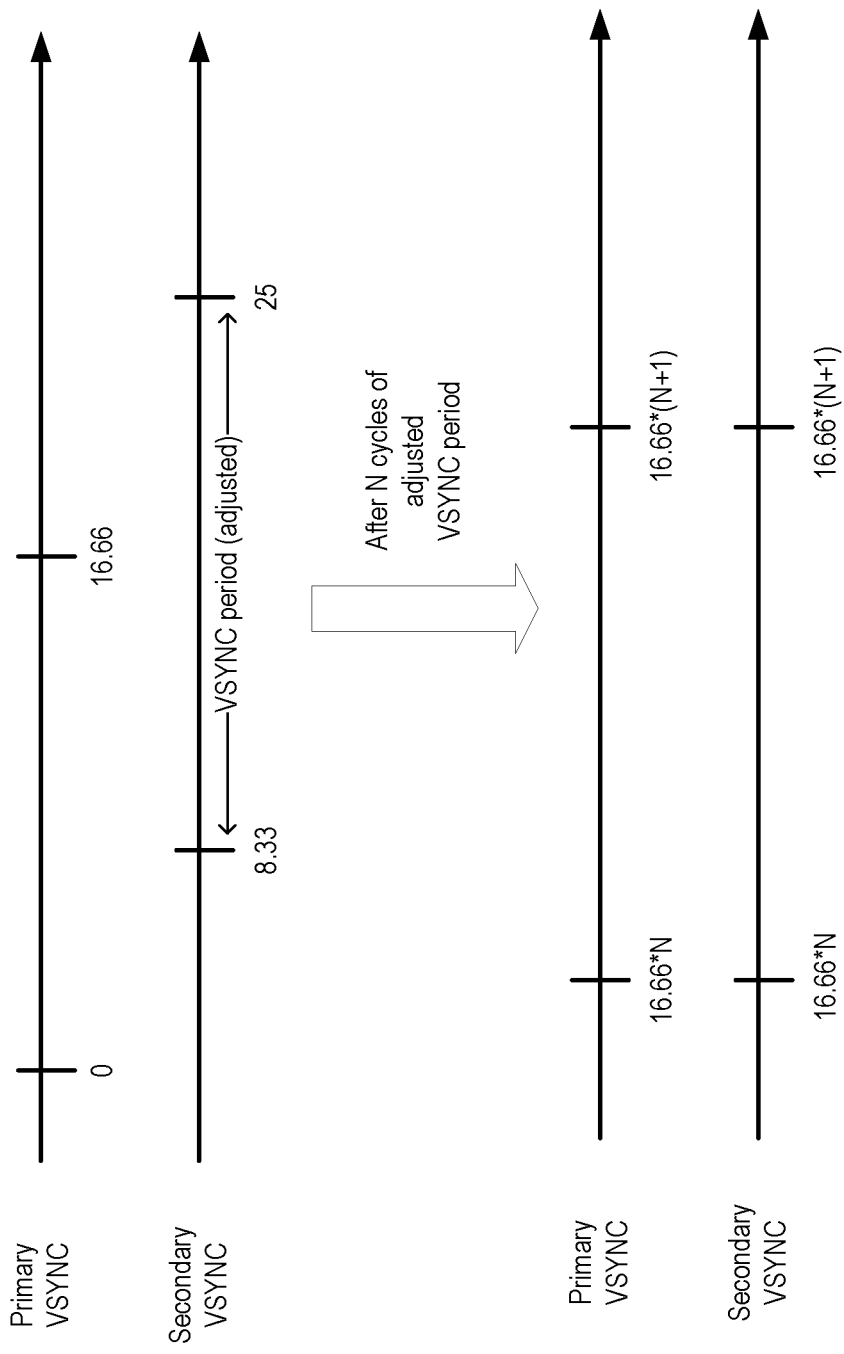
FIG. 3 illustrates example VSYNC timings for a primary and secondary display system before and after applying adjustments in accordance with embodiments of the present disclosure.

FIG. 3 illustrates example VSYNC timings for a primary and secondary display system before and after applying adjustments in accordance with embodiments of the present disclosure. In particular, FIG. 3 illustrates a scenario where both the primary and secondary systems are connected to displays with a 60 Hz refresh rate. The VSYNC period therefore is ⅟60=16.66 ms for both of these systems, as shown at the top of FIG. 3. However, the VSYNC start time for the primary system in the example shown is at time 0, while the VSYNC start time for the secondary system is at time 8.33 ms. This may represent an absolute worst-case scenario as it is exactly at the mid-point of the VSYNC timings of the primary system and, therefore, the time distance between the primary and secondary systems' VSYNC signals cannot be greater.

Once the secondary system moves its pixel clocks by adjusting the integer and fractional dividers as described above with respect to FIG. 2, the VSYNC signal period may be made shorter with the VSYNC signals firing faster (i.e., the duration between two VSYNC signals may be shorter), and the VSYNC signal timing may move fractionally to be closer to that of the primary system. After a number N cycles (which is based on the adjustment factor applied), the VSYNC timings of the primary and secondary systems may be aligned and the VSYNC period of the secondary system may be reverted back to the 16.66 ms.

Table 1 below illustrates example VSYNC period timings before (second column) and after (third column) applying an example adjustment factor of approximately 0.4%. In the example data, a default VSYNC time was observed and found to be 16.669 ms on average. After this, Display phased lock loop (PLL) timing modifications approximately 0.4% were made and the same VSYNC timing was observed again and found to be 16.606 ms. This reflected a change of 62.8 us faster VSYNC period after the change, which amounted to be a −0.37% change in the VSYNC period. Based on this 0.4% change, it stands to reason that after the passage of approximately N=250 such shorter duration VSYNC signals (100/0.4=250), the secondary system's VSYNC signal firing times would now approximately match the primary system's VSYNC signal firing times, as shown by the bottom portion of FIG. 3. Once the VSYNC firing times for both systems are synchronized in this way, the secondary system would revert its integer and fractional dividers to their original values such that the VSYNC firing duration goes back to being ~16.66 ms. After this, the VSYNC signal timings for both systems may be expected to be in synchronization relatively permanently. If any distortion is seen, however, the secondary system may recalculate how much ahead or behind it is from the primary system and readjust with the same algorithm as described above. The fourth column of Table 1 includes additional observed VSYNC period timings after reverting the DPLL back to its original state. As shown, the VSYNC period timings match well with the original VSYNC period timings before adjustment (in the second column).

TABLE 1

Example VSYNC period values before and after adjustment

| Iteration (collected after 1 sec) | VSYNC period (us) before adjusting the Display PLL | VSYNC period (us) after adjusting the Display PLL | VSYNC period (us) after reverting to default Display PLL |
|---|---|---|---|
| 1. | 16676 | 16600 | 16670 |
| 2. | 16676 | 16611 | 16648 |
| 3. | 16665 | 16597 | 16657 |
| 4. | 16677 | 16612 | 16711 |
| 5. | 16676 | 16609 | 16679 |
| 6. | 16687 | 16595 | 16680 |
| 7. | 16666 | 16647 | 16667 |
| 8. | 16653 | 16600 | 16618 |
| 9. | 16676 | 16575 | 16657 |
| 10. | 16676 | 16598 | 16657 |
| 11. | 16667 | 16606 | 16667 |
| 12. | 16664 | 16602 | 16676 |
| 13. | 16655 | 16619 | 16716 |
| 14. | 16666 | 16595 | 16677 |
| 15. | 16656 | 16596 | 16650 |
| 16. | 16657 | 16654 | 16659 |
| 17. | 16672 | 16603 | 16675 |
| 18. | 16673 | 16598 | 16675 |
| 19. | 16669 | 16605 | 16675 |
| 20. | 16674 | 16603 | 16664 |
| AVERAGE | 16669.05 | 16606.25 | 16668.9 |
| DELTA in us (AFTER − BEFORE) | −62.8 | | |
| Delta % (Delta/ Before * 100) | −0.37% | | |

The same algorithm can be applied by multiple secondary systems once they get the VSYNC time information from the primary system as described above, with each secondary system either speeding up or slowing down its VSYNC period to synchronize itself with the primary system in the same manner. Given the example 0.4% change in VSYNC timings per step described above, each of the secondary systems may synchronize itself with the primary system in a relatively short amount of time (e.g., <5 seconds) at run time and with minimal or no perceptible changes to a viewer.

Figure 4:
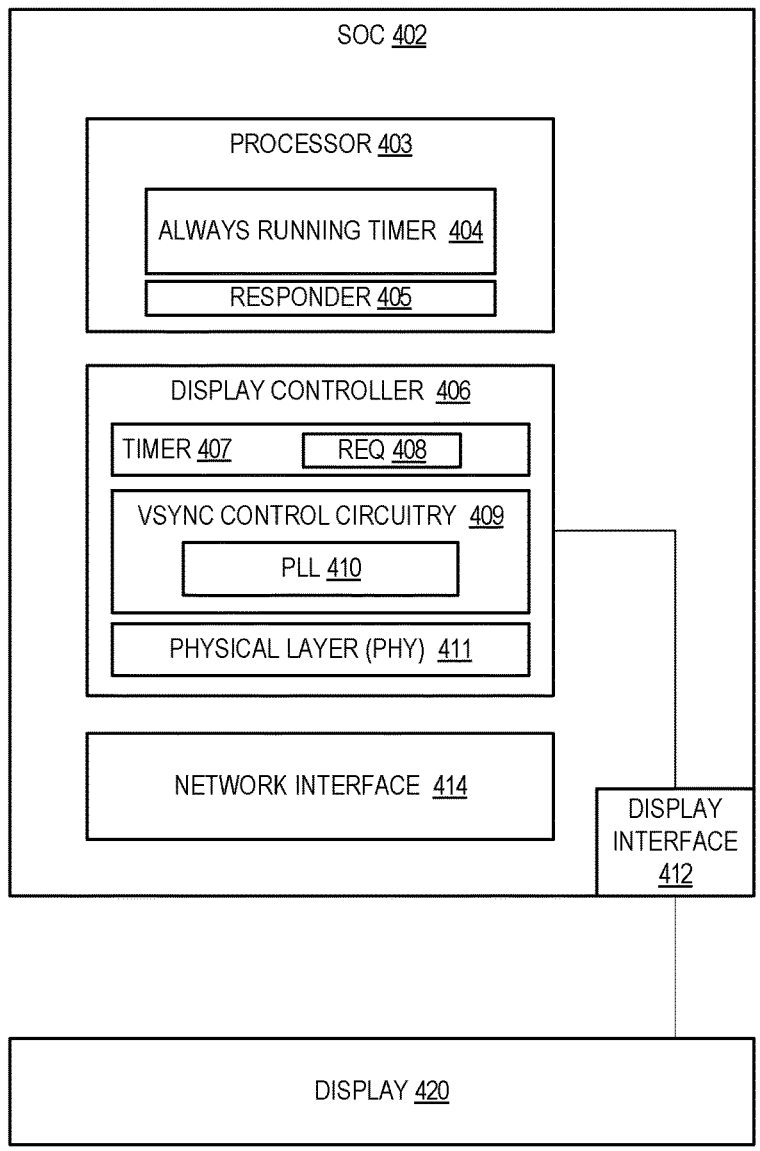
FIG. 4 illustrates a block diagram of an example display system in accordance with embodiments of the present disclosure.

FIG. 4 illustrates a block diagram of an example display system 400 in accordance with embodiments of the present disclosure. The example display system 400 may be implemented in any or each of the systems 112 of FIGS. 1A-1B and/or the systems 210, 220 of FIG. 2. In the example shown, the system 400 includes a system-on-chip (SoC) 402 that includes a processor 403 (e.g., a central processing unit (CPU)), a display controller 406, a display interface 412 connecting the SoC 402 to a display 420, and a network interface 414 to connect the SoC 402 to a network (e.g., network 120 of FIG. 1A or 1B). The network interface 414 may be configure to connect to a wired network (e.g., via Ethernet) or a wireless network (e.g., via an antenna coupled to the system 400).

The processor 403 includes an always running timer (ART) 404 that provides reference timer values for SoC components to use in determining clock signals. The display controller 406 includes its own timer circuitry 407 that cross-timestamps its clock timer value with a timer value received from the ART 404 and VSYNC control circuitry 409 that controls VSYNC signals sent to the display 420. The VSYNC control circuitry 409 includes phased lock loop (PLL) circuitry 410 that controls the VSYNC signal timing, e.g., based on integer and/or fractional divider values in registers of the PLL circuitry 410.

The display controller also includes physical layer (PHY) circuitry 411 that controls the display interface 412. For example, the display interface 412 may include one or more of a high-definition multimedia interface (HDMI) interface, a DisplayPort (DP) interface, a Universal Serial Bus (USB) type-C interface, and/or a video graphics array (VGA) interface, and the PHY circuitry 411 may include an HDMI PHY, DisplayPort PHY, USB type-C PHY, and/or a VGA PHY.

In the example system 400, all IP blocks in the SoC 402 may run off a same base crystal clock, and any IP block within the SoC can request a copy of the processor's ART (which runs on a crystal clock) over the fabric of the SoC. Once a request has been made, the processor provides a copy of the ART value at the instance when the request was asserted and sends the copy of the ART value to the requester. In some embodiments, the display controller 406 may include requester circuitry 408 that periodically requests the ART timer value from the ART 404, and the value is provided by the responder circuitry 405 in the processor 403. This can ensure that the display controller clock is synchronized with the processor clock. The timer circuitry 407 of the display controller 406 receives the copy of the ART timer value and synchronizes it to the pixel clock domain (i.e., at a higher frequency). The ART timer value that is received after each request may be stored in a register of the timer circuitry 407, in some embodiments, e.g., as described below.

In certain embodiments, each display system 400 may also include a variety of other computing resources, such as a graphics processor/GPU, memory, a storage device, and/or input/output (I/O) circuitry, among other examples. Moreover, the display system 400 may be part of a broader system, such as a digital media player (e.g., video streaming device, disc-based media player as Blu-Ray or DVD), a video game console, an edge server, a display device (e.g., one of the display devices in the video wall, such as a television or monitor with an integrated processing device to participate in the video wall), a video wall controller (e.g., a physical case or housing with one or more processing devices to drive the displays of a video wall), a video wall itself (e.g., a collection of displays and the associated processing devices to drive the displays), among other examples.

FIGS. 5A-5B illustrate flowcharts 500, 510 for obtaining VSYNC timestamp values for synchronizing video across multiple displays in accordance with certain embodiments. In some embodiments, operations in the flowcharts 500, 510 may be performed by or using the computing devices, systems, and environments described throughout this disclosure (e.g., the systems 112 of FIGS. 1A-1B, systems 210, 220 of FIG. 2, or computing devices 900, 950 of FIGS.

9A-B). The flowcharts may include additional, fewer, or different operations than those shown.

Referring to FIG. 5A, the flowchart 500 represents an embodiment wherein the system obtains a hardware accurate timer value based on an ART (e.g., ART 404) running on a processor of the system. In particular, a time value is obtained based on an ART value stored in a register of the display controller. At 502, a frame flip occurs in a video signal being processed by the display controller (e.g., 212, 222) of a display system (e.g., 210, 220), and a VSYNC interrupt signal is asserted by the display controller to the display driver (e.g., 214, 224) and at 504, a pixel clock domain timer value is logged in a register of the display controller. At 506, the display driver reads the timer value stored in the register of the display controller each time the frame flip occurs and provides the timer value to a video synchronization application (e.g., 216, 226) running on the system at 508. If the application is executing on a system designated as a primary system, then the application may send the timer value to one or more secondary systems for use in the synchronization techniques described above. In some embodiments, a frame count may also be provided with the timer value.

Referring to FIG. 5B, the flowchart 510 represents an embodiment wherein the system obtains a software accurate timer value based on an ART (e.g., ART 404) running on a processor of the system. In particular, a timer value is requested by the device driver directly from the processor (rather than being taken from a register in the display controller as described above). At 512, a frame flip occurs and a VSYNC interrupt signal is asserted by the display controller to the display driver. However, in contrast to the example in FIG. 5A, at 514, the driver sends a request to a processor of the display system directly to read the processor's ART value, and at 516, the driver sends the timer value to a video synchronization application running on the display system.

In the example of FIG. 5B, any hardware impact caused by the example of FIG. 5A (e.g., requiring hardware logic to log the timer values in the pixel domain) can be avoided. However, there may be a slight compromise on the accuracy level of the timer value (e.g., a few microseconds) because there is some latency added by the request traversing the SoC fabric and because the processor ART timer runs on a low-frequency crystal clock domain while the frame flip occurs on the higher frequency pixel clock domain.

Example Computing Environments

The following sections present examples of computing devices, platforms, systems, and environments that may be used to implement the video synchronization solution described throughout this disclosure.

Edge Computing Embodiments

Figure 6:
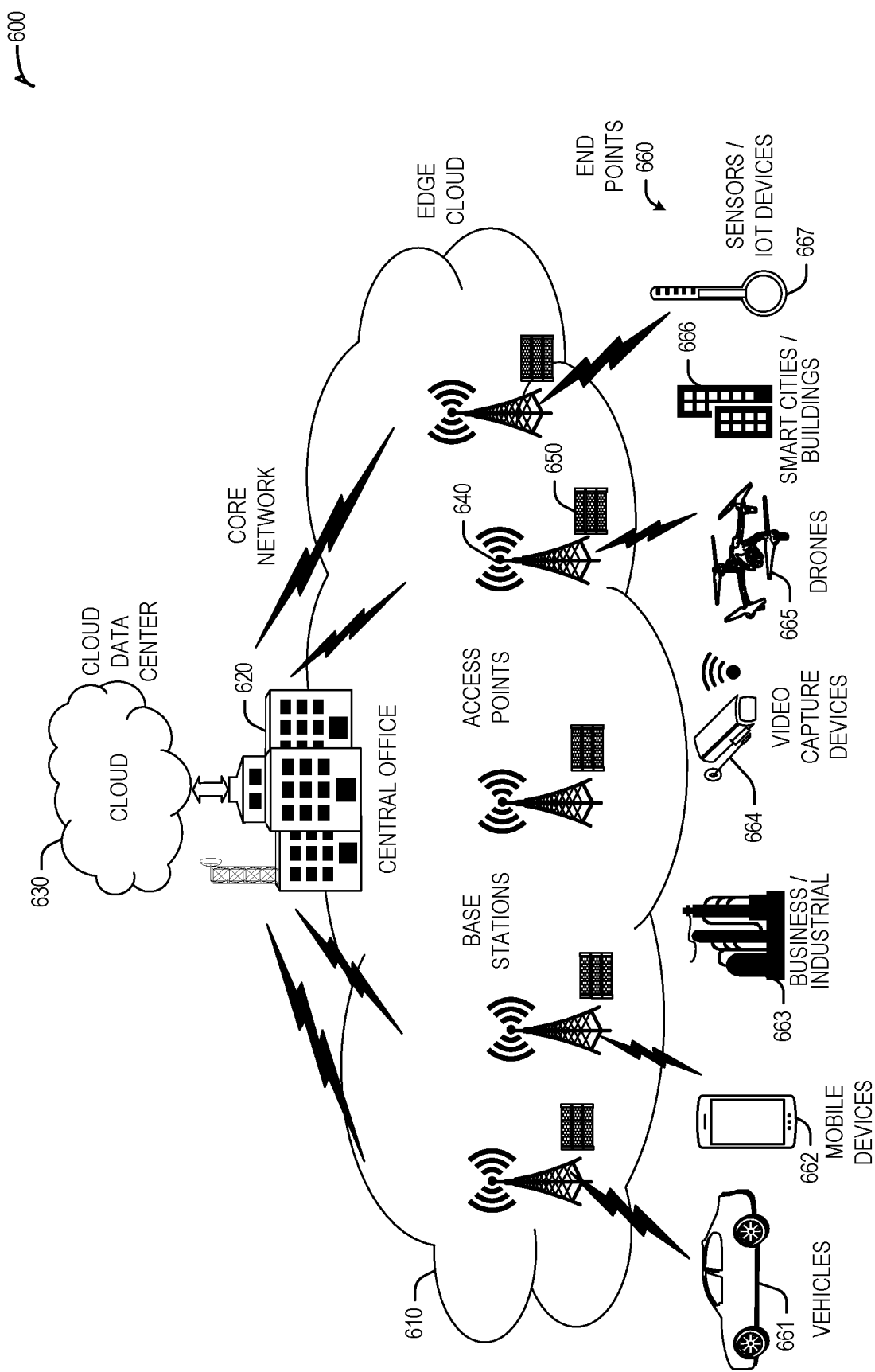
FIG. 6 illustrates an overview of an edge cloud configuration for edge computing.

FIG. 6 is a block diagram 600 showing an overview of a configuration for edge computing, which includes a layer of processing referred to in many of the following examples as an "edge cloud". As shown, the edge cloud 610 is co-located at an edge location, such as an access point or base station 640, a local processing hub 650, or a central office 620, and thus may include multiple entities, devices, and equipment instances. The edge cloud 610 is located much closer to the endpoint (consumer and producer) data sources 660 (e.g., autonomous vehicles 661, user equipment 662, business and industrial equipment 663, video capture devices 664, drones 665, smart cities and building devices 666, sensors and IoT devices 667, etc.) than the cloud data center 630. Compute, memory, and storage resources which are offered at the edges in the edge cloud 610 are critical to providing ultra-low latency response times for services and functions used by the endpoint data sources 660 as well as reduce network backhaul traffic from the edge cloud 610 toward cloud data center 630 thus improving energy consumption and overall network usages among other benefits.

Compute, memory, and storage are scarce resources, and generally decrease depending on the edge location (e.g., fewer processing resources being available at consumer endpoint devices, than at a base station, than at a central office). However, the closer that the edge location is to the endpoint (e.g., user equipment (UE)), the more that space and power is often constrained. Thus, edge computing attempts to reduce the amount of resources needed for network services, through the distribution of more resources which are located closer both geographically and in network access time. In this manner, edge computing attempts to bring the compute resources to the workload data where appropriate, or, bring the workload data to the compute resources.

The following describes aspects of an edge cloud architecture that covers multiple potential deployments and addresses restrictions that some network operators or service providers may have in their own infrastructures. These include, variation of configurations based on the edge location (because edges at a base station level, for instance, may have more constrained performance and capabilities in a multi-tenant scenario); configurations based on the type of compute, memory, storage, fabric, acceleration, or like resources available to edge locations, tiers of locations, or groups of locations; the service, security, and management and orchestration capabilities; and related objectives to achieve usability and performance of end services. These deployments may accomplish processing in network layers that may be considered as "near edge", "close edge", "local edge", "middle edge", or "far edge" layers, depending on latency, distance, and timing characteristics.

Edge computing is a developing paradigm where computing is performed at or closer to the "edge" of a network, typically through the use of a compute platform (e.g., x86 or ARM compute hardware architecture) implemented at base stations, gateways, network routers, or other devices which are much closer to endpoint devices producing and consuming the data. For example, edge gateway servers may be equipped with pools of memory and storage resources to perform computation in real-time for low latency use-cases (e.g., autonomous driving or video surveillance) for connected client devices. Or as an example, base stations may be augmented with compute and acceleration resources to directly process service workloads for connected user equipment, without further communicating data via backhaul networks. Or as another example, central office network management hardware may be replaced with standardized compute hardware that performs virtualized network functions and offers compute resources for the execution of services and consumer functions for connected devices. Within edge computing networks, there may be scenarios in services which the compute resource will be "moved" to the data, as well as scenarios in which the data will be "moved" to the compute resource. Or as an example, base station compute, acceleration and network resources can provide services in order to scale to workload demands on an as needed basis by activating dormant capacity (subscription, capacity on demand) in order to manage corner cases, emergencies or to provide longevity for deployed resources over a significantly longer implemented lifecycle.

Figure 7:
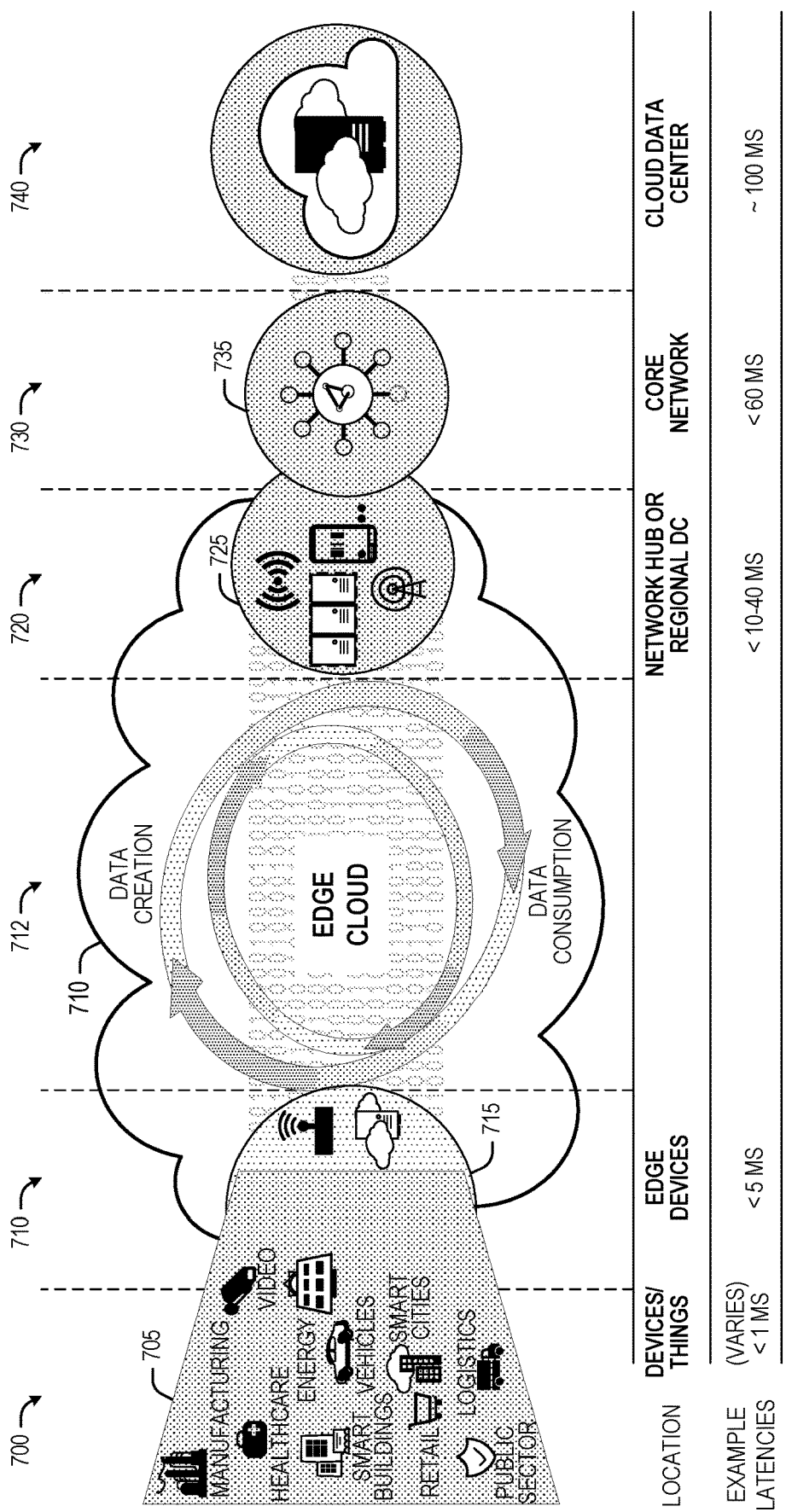
FIG. 7 illustrates operational layers among endpoints, an edge cloud, and cloud computing environments.

FIG. 7 illustrates operational layers among endpoints, an edge cloud, and cloud computing environments. Specifically, FIG. 7 depicts examples of computational use cases 705, utilizing the edge cloud 610 among multiple illustrative layers of network computing. The layers begin at an endpoint (devices and things) layer 700, which accesses the edge cloud 610 to conduct data creation, analysis, and data consumption activities. The edge cloud 610 may span multiple network layers, such as an edge devices layer 710 having gateways, on-premise servers, or network equipment (nodes 715) located in physically proximate edge systems; a network access layer 720, encompassing base stations, radio processing units, network hubs, regional data centers (DC), or local network equipment (equipment 725); and any equipment, devices, or nodes located therebetween (in layer 712, not illustrated in detail). The network communications within the edge cloud 610 and among the various layers may occur via any number of wired or wireless mediums, including via connectivity architectures and technologies not depicted.

Examples of latency, resulting from network communication distance and processing time constraints, may range from less than a millisecond (ms) when among the endpoint layer 700, under 5 ms at the edge devices layer 710, to even between 10 to 40 ms when communicating with nodes at the network access layer 720. Beyond the edge cloud 610 are core network 730 and cloud data center 740 layers, each with increasing latency (e.g., between 50-60 ms at the core network layer 730, to 100 or more ms at the cloud data center layer). As a result, operations at a core network data center 735 or a cloud data center 745, with latencies of at least 50 to 100 ms or more, will not be able to accomplish many time-critical functions of the use cases 705. Each of these latency values are provided for purposes of illustration and contrast; it will be understood that the use of other access network mediums and technologies may further reduce the latencies. In some examples, respective portions of the network may be categorized as "close edge", "local edge", "near edge", "middle edge", or "far edge" layers, relative to a network source and destination. For instance, from the perspective of the core network data center 735 or a cloud data center 745, a central office or content data network may be considered as being located within a "near edge" layer ("near" to the cloud, having high latency values when communicating with the devices and endpoints of the use cases 705), whereas an access point, base station, on-premise server, or network gateway may be considered as located within a "far edge" layer ("far" from the cloud, having low latency values when communicating with the devices and endpoints of the use cases 705). It will be understood that other categorizations of a particular network layer as constituting a "close", "local", "near", "middle", or "far" edge may be based on latency, distance, number of network hops, or other measurable characteristics, as measured from a source in any of the network layers 700-740.

The various use cases 705 may access resources under usage pressure from incoming streams, due to multiple services utilizing the edge cloud. To achieve results with low latency, the services executed within the edge cloud 610 balance varying requirements in terms of: (a) Priority (throughput or latency) and Quality of Service (QoS) (e.g., traffic for an autonomous car may have higher priority than a temperature sensor in terms of response time requirement; or, a performance sensitivity/bottleneck may exist at a compute/accelerator, memory, storage, or network resource, depending on the application); (b) Reliability and Resiliency (e.g., some input streams need to be acted upon and the traffic routed with mission-critical reliability, where as some other input streams may be tolerate an occasional failure, depending on the application); and (c) Physical constraints (e.g., power, cooling and form-factor).

The end-to-end service view for these use cases involves the concept of a service-flow and is associated with a transaction. The transaction details the overall service requirement for the entity consuming the service, as well as the associated services for the resources, workloads, workflows, and business functional and business level requirements. The services executed with the "terms" described may be managed at each layer in a way to assure real time, and runtime contractual compliance for the transaction during the lifecycle of the service. When a component in the transaction is missing its agreed to SLA, the system as a whole (components in the transaction) may provide the ability to (1) understand the impact of the SLA violation, and (2) augment other components in the system to resume overall transaction SLA, and (3) implement steps to remediate.

Thus, with these variations and service features in mind, edge computing within the edge cloud 610 may provide the ability to serve and respond to multiple applications of the use cases 705 (e.g., object tracking, video surveillance, connected cars, etc.) in real-time or near real-time, and meet ultra-low latency requirements for these multiple applications. These advantages enable a whole new class of applications (Virtual Network Functions (VNFs), Function as a Service (FaaS), Edge as a Service (EaaS), standard processes, etc.), which cannot leverage conventional cloud computing due to latency or other limitations.

However, with the advantages of edge computing comes the following caveats. The devices located at the edge are often resource constrained and therefore there is pressure on usage of edge resources. Typically, this is addressed through the pooling of memory and storage resources for use by multiple users (tenants) and devices. The edge may be power and cooling constrained and therefore the power usage needs to be accounted for by the applications that are consuming the most power. There may be inherent power-performance tradeoffs in these pooled memory resources, as many of them are likely to use emerging memory technologies, where more power requires greater memory bandwidth. Likewise, improved security of hardware and root of trust trusted functions are also required, because edge locations may be unmanned and may even need permissioned access (e.g., when housed in a third-party location). Such issues are magnified in the edge cloud 610 in a multi-tenant, multi-owner, or multi-access setting, where services and applications are requested by many users, especially as network usage dynamically fluctuates and the composition of the multiple stakeholders, use cases, and services changes.

At a more generic level, an edge computing system may be described to encompass any number of deployments at the previously discussed layers operating in the edge cloud 610 (network layers 700-740), which provide coordination from client and distributed computing devices. One or more edge gateway nodes, one or more edge aggregation nodes, and one or more core data centers may be distributed across layers of the network to provide an implementation of the edge computing system by or on behalf of a telecommunication service provider ("telco", or "TSP"), internet-of-things service provider, cloud service provider (CSP), enterprise entity, or any other number of entities. Various implementations and configurations of the edge computing system may be provided dynamically, such as when orchestrated to meet service objectives.

Consistent with the examples provided herein, a client compute node may be embodied as any type of endpoint component, device, appliance, or other thing capable of communicating as a producer or consumer of data. Further, the label "node" or "device" as used in the edge computing system does not necessarily mean that such node or device operates in a client or agent/minion/follower role; rather, any of the nodes or devices in the edge computing system refer to individual entities, nodes, or subsystems which include discrete or connected hardware or software configurations to facilitate or use the edge cloud 610.

As such, the edge cloud 610 is formed from network components and functional features operated by and within edge gateway nodes, edge aggregation nodes, or other edge compute nodes among network layers 710-730. The edge cloud 610 thus may be embodied as any type of network that provides edge computing and/or storage resources which are proximately located to radio access network (RAN) capable endpoint devices (e.g., mobile computing devices, IoT devices, smart devices, etc.), which are discussed herein. In other words, the edge cloud 610 may be envisioned as an "edge" which connects the endpoint devices and traditional network access points that serve as an ingress point into service provider core networks, including mobile carrier networks (e.g., Global System for Mobile Communications (GSM) networks, Long-Term Evolution (LTE) networks, 5G/6G networks, etc.), while also providing storage and/or compute capabilities. Other types and forms of network access (e.g., Wi-Fi, long-range wireless, wired networks including optical networks) may also be utilized in place of or in combination with such 3GPP carrier networks.

The network components of the edge cloud 610 may be servers, multi-tenant servers, appliance computing devices, and/or any other type of computing devices. For example, the edge cloud 610 may include an appliance computing device that is a self-contained electronic device including a housing, a chassis, a case or a shell. In some circumstances, the housing may be dimensioned for portability such that it can be carried by a human and/or shipped. Example housings may include materials that form one or more exterior surfaces that partially or fully protect contents of the appliance, in which protection may include weather protection, hazardous environment protection (e.g., EMI, vibration, extreme temperatures), and/or enable submergibility. Example housings may include power circuitry to provide power for stationary and/or portable implementations, such as AC power inputs, DC power inputs, AC/DC or DC/AC converter(s), power regulators, transformers, charging circuitry, batteries, wired inputs and/or wireless power inputs. Example housings and/or surfaces thereof may include or connect to mounting hardware to enable attachment to structures such as buildings, telecommunication structures (e.g., poles, antenna structures, etc.) and/or racks (e.g., server racks, blade mounts, etc.). Example housings and/or surfaces thereof may support one or more sensors (e.g., temperature sensors, vibration sensors, light sensors, acoustic sensors, capacitive sensors, proximity sensors, etc.). One or more such sensors may be contained in, carried by, or otherwise embedded in the surface and/or mounted to the surface of the appliance. Example housings and/or surfaces thereof may support mechanical connectivity, such as propulsion hardware (e.g., wheels, propellers, etc.) and/or articulating hardware (e.g., robot arms, pivotable appendages, etc.). In some circumstances, the sensors may include any type of input devices such as user interface hardware (e.g., buttons, switches, dials, sliders, etc.). In some circumstances, example housings include output devices contained in, carried by, embedded therein and/or attached thereto. Output devices may include displays, touchscreens, lights, LEDs, speakers, I/O ports (e.g., USB), etc. In some circumstances, edge devices are devices presented in the network for a specific purpose (e.g., a traffic light), but may have processing and/or other capacities that may be utilized for other purposes. Such edge devices may be independent from other networked devices and may be provided with a housing having a form factor suitable for its primary purpose; yet be available for other compute tasks that do not interfere with its primary task. Edge devices include Internet of Things devices. The appliance computing device may include hardware and software components to manage local issues such as device temperature, vibration, resource utilization, updates, power issues, physical and network security, etc. Example hardware for implementing an appliance computing device is described in conjunction with FIG. 9B. The edge cloud 610 may also include one or more servers and/or one or more multi-tenant servers. Such a server may include an operating system and implement a virtual computing environment. A virtual computing environment may include a hypervisor managing (e.g., spawning, deploying, destroying, etc.) one or more virtual machines, one or more containers, etc. Such virtual computing environments provide an execution environment in which one or more applications and/or other software, code or scripts may execute while being isolated from one or more other applications, software, code or scripts.

Figure 8:
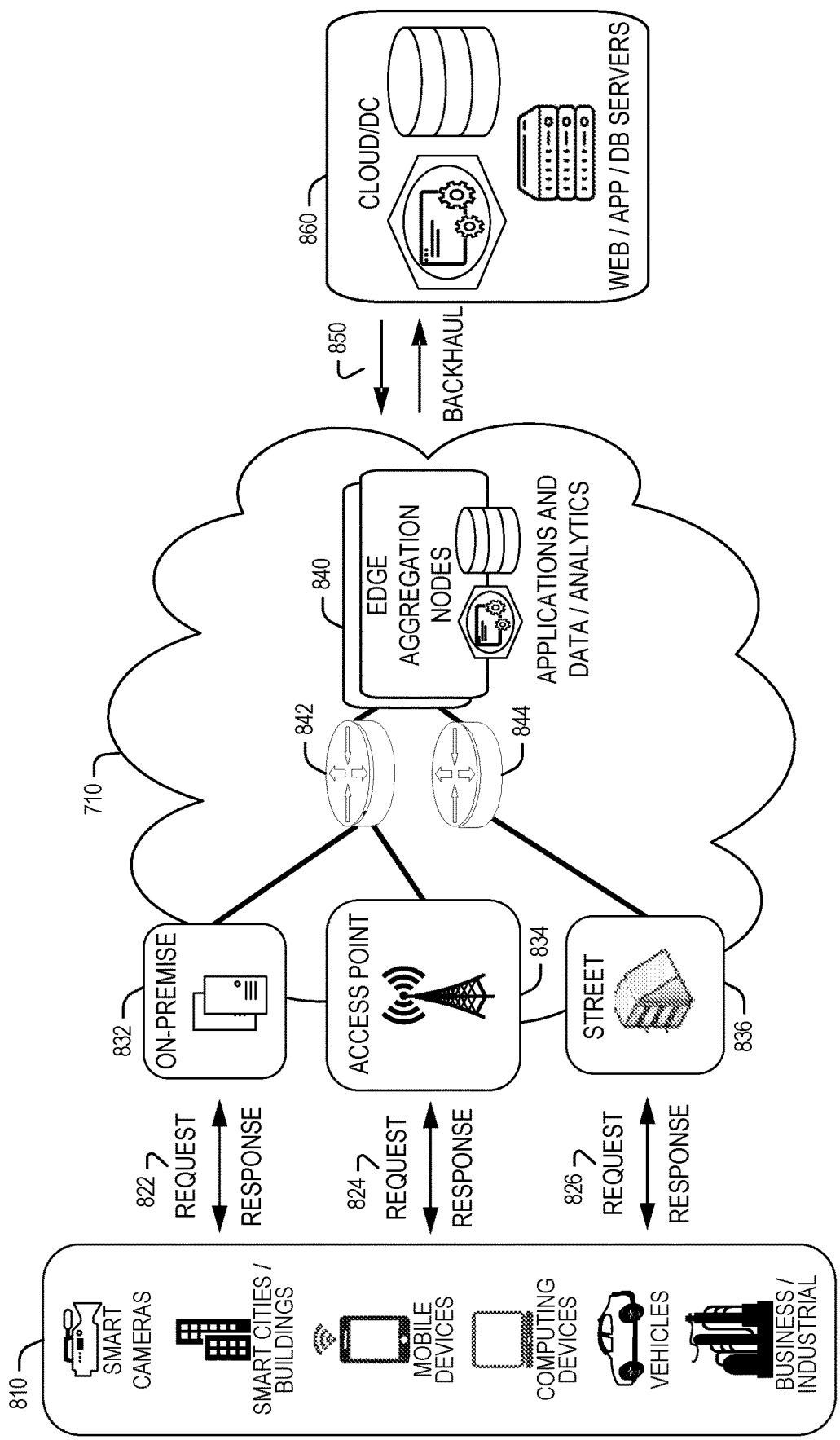
FIG. 8 illustrates an example approach for networking and services in an edge computing system.

In FIG. 8, various client endpoints 810 (in the form of smart cameras, mobile devices, computers, autonomous vehicles, business computing equipment, industrial processing equipment) exchange requests and responses that are specific to the type of endpoint network aggregation. For instance, client endpoints 810 may obtain network access via a wired broadband network, by exchanging requests and responses 822 through an on-premise network system 832. Some client endpoints 810, such as smart cameras, may obtain network access via a wireless broadband network, by exchanging requests and responses 824 through an access point (e.g., cellular network tower) 834. Some client endpoints 810, such as autonomous vehicles may obtain network access for requests and responses 826 via a wireless vehicular network through a street-located network system 836. However, regardless of the type of network access, the TSP may deploy aggregation points 842, 844 within the edge cloud 610 to aggregate traffic and requests. Thus, within the edge cloud 610, the TSP may deploy various compute and storage resources, such as at edge aggregation nodes 840, to provide requested content. The edge aggregation nodes 840 and other systems of the edge cloud 610 are connected to a cloud or data center 860, which uses a backhaul network 850 to fulfill higher-latency requests from a cloud/data center for websites, applications, database servers, etc. Additional or consolidated instances of the edge aggregation nodes 840 and the aggregation points 842, 844, including those deployed on a single server framework, may also be present within the edge cloud 610 or other areas of the TSP infrastructure.

Computing Devices and Systems

In further examples, any of the compute nodes or devices discussed with reference to the present edge computing systems and environment may be fulfilled based on the components depicted in FIGS. 9A-B. Respective edge compute nodes may be embodied as a type of device, appliance, computer, or other "thing" capable of communicating with other edge, networking, or endpoint components. For example, an edge compute device may be embodied as a personal computer, server, smartphone, a mobile compute device, a smart appliance, an in-vehicle compute system (e.g., a navigation system), a self-contained device having an outer case, shell, etc., or other device or system capable of performing the described functions.

Figure 9A:
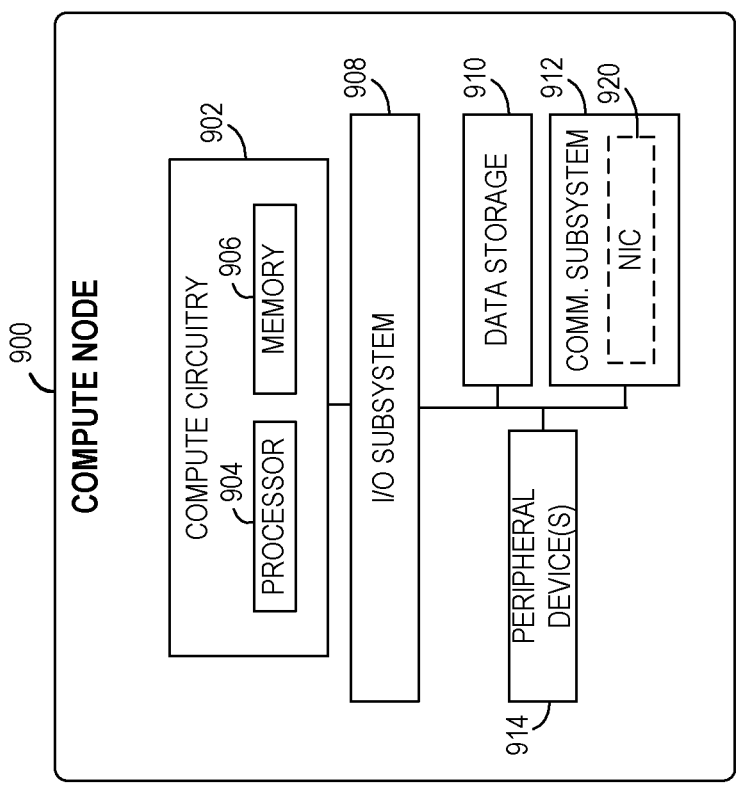
FIG. 9A provides an overview of example components for compute deployed at a compute node in an edge computing system.

In the simplified example depicted in FIG. 9A, an edge compute node 900 includes a compute engine (also referred to herein as "compute circuitry") 902, an input/output (I/O) subsystem 908, data storage 910, a communication circuitry subsystem 912, and, optionally, one or more peripheral devices 914. In other examples, respective compute devices may include other or additional components, such as those typically found in a computer (e.g., a display, peripheral devices, etc.). Additionally, in some examples, one or more of the illustrative components may be incorporated in, or otherwise form a portion of, another component.

The compute node 900 may be embodied as any type of engine, device, or collection of devices capable of performing various compute functions. In some examples, the compute node 900 may be embodied as a single device such as an integrated circuit, an embedded system, a field-programmable gate array (FPGA), a system-on-a-chip (SOC), or other integrated system or device. In the illustrative example, the compute node 900 includes or is embodied as a processor 904 and a memory 906. The processor 904 may be embodied as any type of processor capable of performing the functions described herein (e.g., executing an application). For example, the processor 904 may be embodied as a multi-core processor(s), a microcontroller, a processing unit, a specialized or special purpose processing unit, or other processor or processing/controlling circuit.

In some examples, the processor 904 may be embodied as, include, or be coupled to an FPGA, an application specific integrated circuit (ASIC), reconfigurable hardware or hardware circuitry, or other specialized hardware to facilitate performance of the functions described herein. Also in some examples, the processor 704 may be embodied as a specialized x-processing unit (xPU) also known as a data processing unit (DPU), infrastructure processing unit (IPU), or network processing unit (NPU). Such an xPU may be embodied as a standalone circuit or circuit package, integrated within an SOC, or integrated with networking circuitry (e.g., in a SmartNIC, or enhanced SmartNIC), acceleration circuitry, storage devices, or AI hardware (e.g., GPUs or programmed FPGAs). Such an xPU may be designed to receive programming to process one or more data streams and perform specific tasks and actions for the data streams (such as hosting microservices, performing service management or orchestration, organizing or managing server or data center hardware, managing service meshes, or collecting and distributing telemetry), outside of the CPU or general purpose processing hardware. However, it will be understood that a xPU, a SOC, a CPU, and other variations of the processor 904 may work in coordination with each other to execute many types of operations and instructions within and on behalf of the compute node 900.

The memory 906 may be embodied as any type of volatile (e.g., dynamic random access memory (DRAM), etc.) or non-volatile memory or data storage capable of performing the functions described herein. Volatile memory may be a storage medium that requires power to maintain the state of data stored by the medium. Non-limiting examples of volatile memory may include various types of random access memory (RAM), such as DRAM or static random access memory (SRAM). One particular type of DRAM that may be used in a memory module is synchronous dynamic random access memory (SDRAM).

In an example, the memory device is a block addressable memory device, such as those based on NAND or NOR technologies. A memory device may also include a three dimensional crosspoint memory device (e.g., Intel® 3D XPoint™ memory), or other byte addressable write-in-place nonvolatile memory devices. The memory device may refer to the die itself and/or to a packaged memory product. In some examples, 3D crosspoint memory (e.g., Intel® 3D XPoint™ memory) may comprise a transistor-less stackable cross point architecture in which memory cells sit at the intersection of word lines and bit lines and are individually addressable and in which bit storage is based on a change in bulk resistance. In some examples, all or a portion of the memory 906 may be integrated into the processor 904. The memory 906 may store various software and data used during operation such as one or more applications, data operated on by the application(s), libraries, and drivers.

The compute circuitry 902 is communicatively coupled to other components of the compute node 900 via the I/O subsystem 908, which may be embodied as circuitry and/or components to facilitate input/output operations with the compute circuitry 902 (e.g., with the processor 904 and/or the main memory 906) and other components of the compute circuitry 902. For example, the I/O subsystem 908 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some examples, the I/O subsystem 908 may form a portion of a system-on-a-chip (SoC) and be incorporated, along with one or more of the processor 904, the memory 906, and other components of the compute circuitry 902, into the compute circuitry 902.

The one or more illustrative data storage devices 910 may be embodied as any type of devices configured for short-term or long-term storage of data such as, for example, memory devices and circuits, memory cards, hard disk drives, solid-state drives, or other data storage devices. Individual data storage devices 910 may include a system partition that stores data and firmware code for the data storage device 910. Individual data storage devices 910 may also include one or more operating system partitions that store data files and executables for operating systems depending on, for example, the type of compute node 900.

The communication circuitry 912 may be embodied as any communication circuit, device, or collection thereof, capable of enabling communications over a network between the compute circuitry 902 and another compute device (e.g., an edge gateway of an implementing edge computing system). The communication circuitry 912 may be configured to use any one or more communication technology (e.g., wired or wireless communications) and associated protocols (e.g., a cellular networking protocol such a 3GPP 4G or 5G standard, a wireless local area network protocol such as IEEE 802.11/Wi-Fi®, a wireless wide area network protocol, Ethernet, Bluetooth®, Bluetooth Low Energy, a IoT protocol such as IEEE 802.15.4 or ZigBee®, low-power wide-area network (LPWAN) or low-power wide-area (LPWA) protocols, etc.) to effect such communication.

The illustrative communication circuitry 912 includes a network interface controller (NIC) 920, which may also be referred to as a host fabric interface (HFI). The NIC 920 may be embodied as one or more add-in-boards, daughter cards, network interface cards, controller chips, chipsets, or other devices that may be used by the compute node 900 to connect with another compute device (e.g., an edge gateway node). In some examples, the NIC 920 may be embodied as part of a system-on-a-chip (SoC) that includes one or more processors, or included on a multichip package that also contains one or more processors. In some examples, the NIC 920 may include a local processor (not shown) and/or a local memory (not shown) that are both local to the NIC 920. In such examples, the local processor of the NIC 920 may be capable of performing one or more of the functions of the compute circuitry 902 described herein. Additionally, or alternatively, in such examples, the local memory of the NIC 920 may be integrated into one or more components of the client compute node at the board level, socket level, chip level, and/or other levels.

Additionally, in some examples, a respective compute node 900 may include one or more peripheral devices 914. Such peripheral devices 914 may include any type of peripheral device found in a compute device or server such as audio input devices, a display, other input/output devices, interface devices, and/or other peripheral devices, depending on the particular type of the compute node 900. In further examples, the compute node 900 may be embodied by a respective edge compute node (whether a client, gateway, or aggregation node) in an edge computing system or like forms of appliances, computers, subsystems, circuitry, or other components.

Figure 9B:
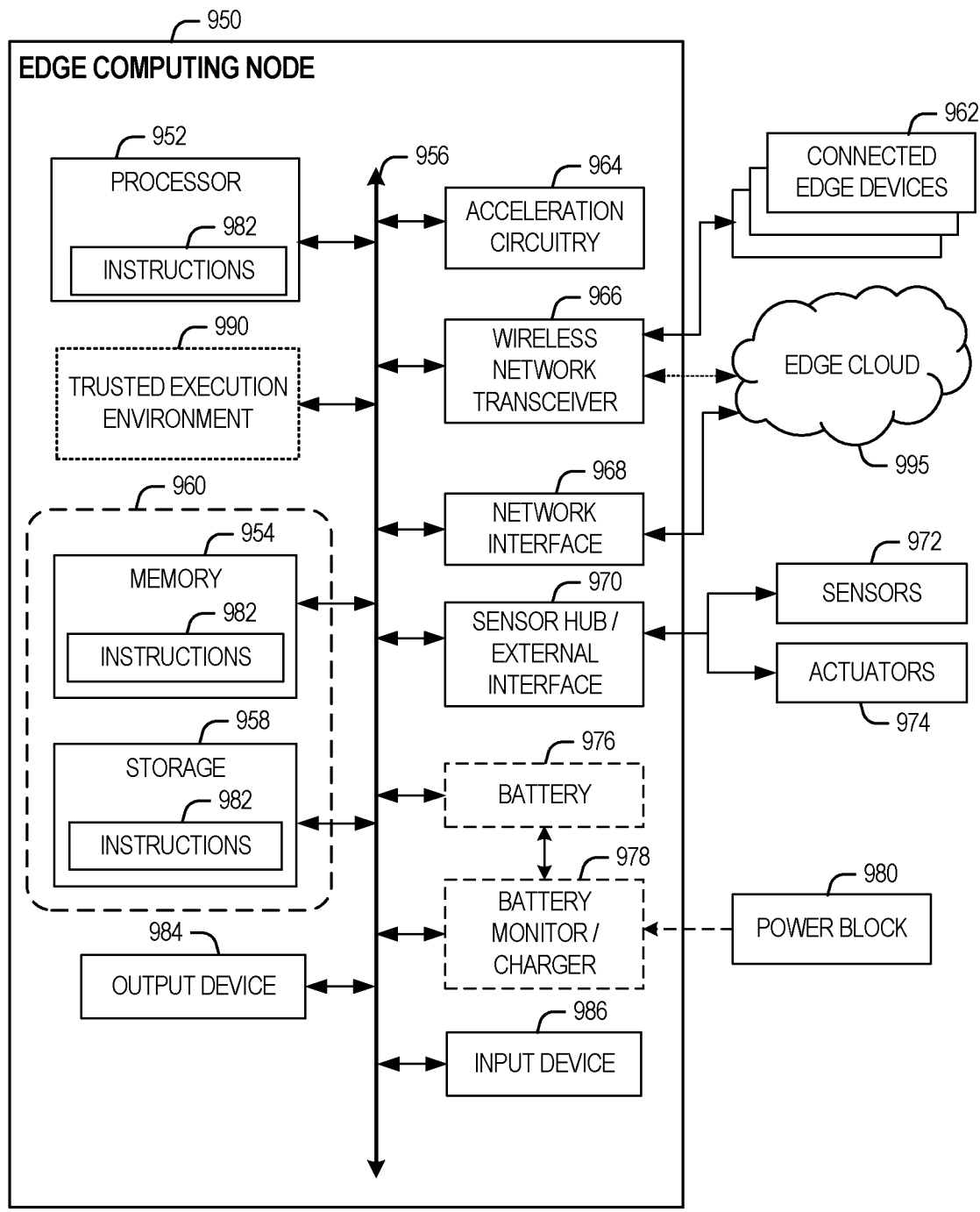
FIG. 9B provides a further overview of example components within a computing device in an edge computing system.

In a more detailed example, FIG. 9B illustrates a block diagram of an example of components that may be present in an edge computing node 950 for implementing the techniques (e.g., operations, processes, methods, and methodologies) described herein. This edge computing node 950 provides a closer view of the respective components of node 900 when implemented as or as part of a computing device (e.g., as a mobile device, a base station, server, gateway, etc.). The edge computing node 950 may include any combinations of the hardware or logical components referenced herein, and it may include or couple with any device usable with an edge communication network or a combination of such networks. The components may be implemented as integrated circuits (ICs), portions thereof, discrete electronic devices, or other modules, instruction sets, programmable logic or algorithms, hardware, hardware accelerators, software, firmware, or a combination thereof adapted in the edge computing node 950, or as components otherwise incorporated within a chassis of a larger system.

The edge computing device 950 may include processing circuitry in the form of a processor 952, which may be a microprocessor, a multi-core processor, a multithreaded processor, an ultra-low voltage processor, an embedded processor, an xPU/DPU/IPU/NPU, special purpose processing unit, specialized processing unit, or other known processing elements. The processor 952 may be a part of a system on a chip (SoC) in which the processor 952 and other components are formed into a single integrated circuit, or a single package, such as the Edison™ or Galileo™ SoC boards from Intel Corporation, Santa Clara, California. As an example, the processor 952 may include an Intel® Architecture Core™ based CPU processor, such as a Quark™, an Atom™, an i3, an i5, an i7, an i9, or an MCU-class processor, or another such processor available from Intel®. However, any number other processors may be used, such as available from Advanced Micro Devices, Inc. (AMD®) of Sunnyvale, California, a MIPS®-based design from MIPS Technologies, Inc. of Sunnyvale, California, an ARM®-based design licensed from ARM Holdings, Ltd. or a customer thereof, or their licensees or adopters. The processors may include units such as an A5-A13 processor from Apple® Inc., a Snapdragon™ processor from Qualcomm® Technologies, Inc., or an OMAP™ processor from Texas Instruments, Inc. The processor 952 and accompanying circuitry may be provided in a single socket form factor, multiple socket form factor, or a variety of other formats, including in limited hardware configurations or configurations that include fewer than all elements shown in FIG. 9B.

The processor 952 may communicate with a system memory 954 over an interconnect 956 (e.g., a bus). Any number of memory devices may be used to provide for a given amount of system memory. As examples, the memory 754 may be random access memory (RAM) in accordance with a Joint Electron Devices Engineering Council (JEDEC) design such as the DDR or mobile DDR standards (e.g., LPDDR, LPDDR2, LPDDR3, or LPDDR4). In particular examples, a memory component may comply with a DRAM standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces. In various implementations, the individual memory devices may be of any number of different package types such as single die package (SDP), dual die package (DDP) or quad die package (Q17P). These devices, in some examples, may be directly soldered onto a motherboard to provide a lower profile solution, while in other examples the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs.

To provide for persistent storage of information such as data, applications, operating systems and so forth, a storage 958 may also couple to the processor 952 via the interconnect 956. In an example, the storage 958 may be implemented via a solid-state disk drive (SSDD). Other devices that may be used for the storage 958 include flash memory cards, such as Secure Digital (SD) cards, microSD cards, eXtreme Digital (XD) picture cards, and the like, and Universal Serial Bus (USB) flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

In low power implementations, the storage 958 may be on-die memory or registers associated with the processor 952. However, in some examples, the storage 958 may be implemented using a micro hard disk drive (HDD). Further, any number of new technologies may be used for the storage 958 in addition to, or instead of, the technologies described, such resistance change memories, phase change memories, holographic memories, or chemical memories, among others.

The components may communicate over the interconnect 956. The interconnect 956 may include any number of technologies, including industry standard architecture (ISA), extended ISA (EISA), peripheral component interconnect (PCI), peripheral component interconnect extended (PCIx), PCI express (PCIe), or any number of other technologies. The interconnect 956 may be a proprietary bus, for example, used in an SoC based system. Other bus systems may be included, such as an Inter-Integrated Circuit (I2C) interface, a Serial Peripheral Interface (SPI) interface, point to point interfaces, and a power bus, among others.

The interconnect 956 may couple the processor 952 to a transceiver 966, for communications with the connected edge devices 962. The transceiver 966 may use any number of frequencies and protocols, such as 2.4 Gigahertz (GHz) transmissions under the IEEE 802.15.4 standard, using the Bluetooth® low energy (BLE) standard, as defined by the Bluetooth® Special Interest Group, or the ZigBee® standard, among others. Any number of radios, configured for a particular wireless communication protocol, may be used for the connections to the connected edge devices 962. For example, a wireless local area network (WLAN) unit may be used to implement Wi-Fi® communications in accordance with the Institute of Electrical and Electronics Engineers (IEEE) 802.11 standard. In addition, wireless wide area communications, e.g., according to a cellular or other wireless wide area protocol, may occur via a wireless wide area network (WWAN) unit.

The wireless network transceiver 966 (or multiple transceivers) may communicate using multiple standards or radios for communications at a different range. For example, the edge computing node 950 may communicate with close devices, e.g., within about 10 meters, using a local transceiver based on Bluetooth Low Energy (BLE), or another low power radio, to save power. More distant connected edge devices 962, e.g., within about 50 meters, may be reached over ZigBee® or other intermediate power radios. Both communications techniques may take place over a single radio at different power levels or may take place over separate transceivers, for example, a local transceiver using BLE and a separate mesh transceiver using ZigBee®.

A wireless network transceiver 966 (e.g., a radio transceiver) may be included to communicate with devices or services in a cloud (e.g., an edge cloud 995) via local or wide area network protocols. The wireless network transceiver 966 may be a low-power wide-area (LPWA) transceiver that follows the IEEE 802.15.4, or IEEE 802.15.4g standards, among others. The edge computing node 950 may communicate over a wide area using LoRaWAN™ (Long Range Wide Area Network) developed by Semtech and the LoRa Alliance. The techniques described herein are not limited to these technologies but may be used with any number of other cloud transceivers that implement long range, low bandwidth communications, such as Sigfox, and other technologies. Further, other communications techniques, such as time-slotted channel hopping, described in the IEEE 802.15.4e specification may be used.

Any number of other radio communications and protocols may be used in addition to the systems mentioned for the wireless network transceiver 966, as described herein. For example, the transceiver 966 may include a cellular transceiver that uses spread spectrum (SPA/SAS) communications for implementing high-speed communications. Further, any number of other protocols may be used, such as Wi-Fi® networks for medium speed communications and provision of network communications. The transceiver 966 may include radios that are compatible with any number of 3GPP (Third Generation Partnership Project) specifications, such as Long Term Evolution (LTE) and 5th Generation (5G) communication systems, discussed in further detail at the end of the present disclosure. A network interface controller (NIC) 968 may be included to provide a wired communication to nodes of the edge cloud 995 or to other devices, such as the connected edge devices 962 (e.g., operating in a mesh). The wired communication may provide an Ethernet connection or may be based on other types of networks, such as Controller Area Network (CAN), Local Interconnect Network (LIN), DeviceNet, ControlNet, Data Highway+, PROFIBUS, or PROFINET, among many others. An additional NIC 968 may be included to enable connecting to a second network, for example, a first NIC 968 providing communications to the cloud over Ethernet, and a second NIC 968 providing communications to other devices over another type of network.

Given the variety of types of applicable communications from the device to another component or network, applicable communications circuitry used by the device may include or be embodied by any one or more of components 964, 966, 968, or 970. Accordingly, in various examples, applicable means for communicating (e.g., receiving, transmitting, etc.) may be embodied by such communications circuitry.

The edge computing node 950 may include or be coupled to acceleration circuitry 964, which may be embodied by one or more artificial intelligence (AI) accelerators, a neural compute stick, neuromorphic hardware, an FPGA, an arrangement of GPUs, an arrangement of xPUs/DPUs/IPU/NPUs, one or more SoCs, one or more CPUs, one or more digital signal processors, dedicated ASICs, or other forms of specialized processors or circuitry designed to accomplish one or more specialized tasks. These tasks may include AI processing (including machine learning, training, inferencing, and classification operations), visual data processing, network data processing, object detection, rule analysis, or the like. These tasks also may include the specific edge computing tasks for service management and service operations discussed elsewhere in this document.

The interconnect 956 may couple the processor 952 to a sensor hub or external interface 970 that is used to connect additional devices or subsystems. The devices may include sensors 972, such as accelerometers, level sensors, flow sensors, optical light sensors, camera sensors, temperature sensors, global navigation system (e.g., GPS) sensors, pressure sensors, barometric pressure sensors, and the like. The hub or interface 970 further may be used to connect the edge computing node 950 to actuators 974, such as power switches, valve actuators, an audible sound generator, a visual warning device, and the like.

In some optional examples, various input/output (I/O) devices may be present within or connected to, the edge computing node 950. For example, a display or other output device 984 may be included to show information, such as sensor readings or actuator position. An input device 986, such as a touch screen or keypad may be included to accept input. An output device 984 may include any number of forms of audio or visual display, including simple visual outputs such as binary status indicators (e.g., light-emitting diodes (LEDs)) and multi-character visual outputs, or more complex outputs such as display screens (e.g., liquid crystal display (LCD) screens), with the output of characters, graphics, multimedia objects, and the like being generated or produced from the operation of the edge computing node 950. A display or console hardware, in the context of the present system, may be used to provide output and receive input of an edge computing system; to manage components or services of an edge computing system; identify a state of an edge computing component or service; or to conduct any other number of management or administration functions or service use cases.

A battery 976 may power the edge computing node 950, although, in examples in which the edge computing node 950 is mounted in a fixed location, it may have a power supply coupled to an electrical grid, or the battery may be used as a backup or for temporary capabilities. The battery 976 may be a lithium ion battery, or a metal-air battery, such as a zinc-air battery, an aluminum-air battery, a lithium-air battery, and the like.

A battery monitor/charger 978 may be included in the edge computing node 950 to track the state of charge (SoCh) of the battery 976, if included. The battery monitor/charger 978 may be used to monitor other parameters of the battery 976 to provide failure predictions, such as the state of health (SoH) and the state of function (SoF) of the battery 976. The battery monitor/charger 978 may include a battery monitoring integrated circuit, such as an LTC4020 or an LTC2990 from Linear Technologies, an ADT7488A from ON Semiconductor of Phoenix Arizona, or an IC from the UCD90xxx family from Texas Instruments of Dallas, TX The battery monitor/charger 978 may communicate the information on the battery 976 to the processor 952 over the interconnect 956. The battery monitor/charger 978 may also include an analog-to-digital (ADC) converter that enables the processor 952 to directly monitor the voltage of the battery 976 or the current flow from the battery 976. The battery parameters may be used to determine actions that the edge computing node 950 may perform, such as transmission frequency, mesh network operation, sensing frequency, and the like.

A power block 980, or other power supply coupled to a grid, may be coupled with the battery monitor/charger 978 to charge the battery 976. In some examples, the power block 980 may be replaced with a wireless power receiver to obtain the power wirelessly, for example, through a loop antenna in the edge computing node 950. A wireless battery charging circuit, such as an LTC4020 chip from Linear Technologies of Milpitas, California, among others, may be included in the battery monitor/charger 978. The specific charging circuits may be selected based on the size of the battery 976, and thus, the current required. The charging may be performed using the Airfuel standard promulgated by the Airfuel Alliance, the Qi wireless charging standard promulgated by the Wireless Power Consortium, or the Rezence charging standard, promulgated by the Alliance for Wireless Power, among others.

The storage 958 may include instructions 982 in the form of software, firmware, or hardware commands to implement the techniques described herein. Although such instructions 982 are shown as code blocks included in the memory 954 and the storage 958, it may be understood that any of the code blocks may be replaced with hardwired circuits, for example, built into an application specific integrated circuit (ASIC).

In an example, the instructions 982 provided via the memory 954, the storage 958, or the processor 952 may be embodied as a non-transitory, machine-readable medium 960 including code to direct the processor 952 to perform electronic operations in the edge computing node 950. The processor 952 may access the non-transitory, machine-readable medium 960 over the interconnect 956. For instance, the non-transitory, machine-readable medium 960 may be embodied by devices described for the storage 958 or may include specific storage units such as optical disks, flash drives, or any number of other hardware devices. The non-transitory, machine-readable medium 960 may include instructions to direct the processor 952 to perform a specific sequence or flow of actions, for example, as described with respect to the flowchart(s) and block diagram(s) of operations and functionality depicted above. As used herein, the terms "machine-readable medium" and "computer-readable medium" are interchangeable.

Also in a specific example, the instructions 982 on the processor 952 (separately, or in combination with the instructions 982 of the machine readable medium 960) may configure execution or operation of a trusted execution environment (TEE) 990. In an example, the TEE 990 operates as a protected area accessible to the processor 952 for secure execution of instructions and secure access to data. Various implementations of the TEE 990, and an accompanying secure area in the processor 952 or the memory 954 may be provided, for instance, through use of Intel® Software Guard Extensions (SGX) or ARM® TrustZone® hardware security extensions, Intel® Management Engine (ME), or Intel® Converged Security Manageability Engine (CSME). Other aspects of security hardening, hardware roots-of-trust, and trusted or protected operations may be implemented in the device 950 through the TEE 990 and the processor 952.

Software Distribution

Figure 10:
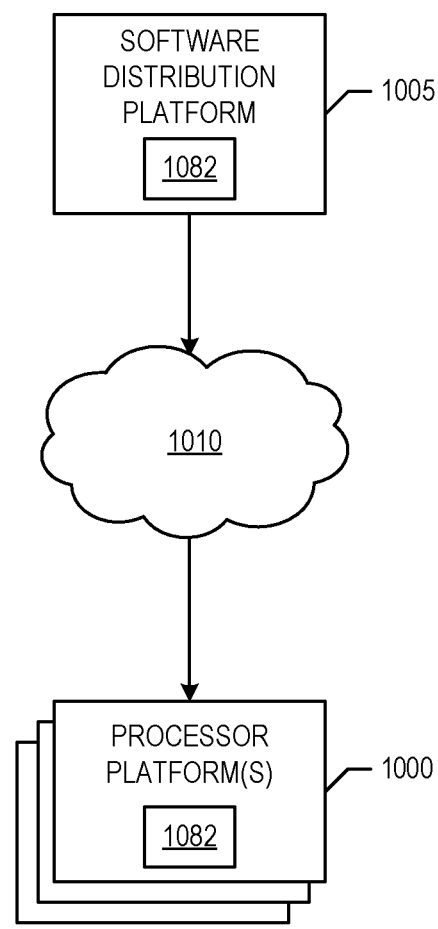
FIG. 10 illustrates an example software distribution platform to distribute software.

FIG. 10 illustrates an example software distribution platform 1005 to distribute software, such as the example computer readable instructions 982 of FIG. 9B, to one or more devices, such as example processor platform(s) 1000 and/or example connected edge devices described throughout this disclosure. The example software distribution platform 1005 may be implemented by any computer server, data facility, cloud service, etc., capable of storing and transmitting software to other computing devices (e.g., third parties, example connected edge devices described throughout this disclosure). Example connected edge devices may be customers, clients, managing devices (e.g., servers), third parties (e.g., customers of an entity owning and/or operating the software distribution platform 1005). Example connected edge devices may operate in commercial and/or home automation environments. In some examples, a third party is a developer, a seller, and/or a licensor of software such as the example computer readable instructions 982 of FIG. 9B. The third parties may be consumers, users, retailers, OEMs, etc. that purchase and/or license the software for use and/or re-sale and/or sub-licensing. In some examples, distributed software causes display of one or more user interfaces (UIs) and/or graphical user interfaces (GUIs) to identify the one or more devices (e.g., connected edge devices) geographically and/or logically separated from each other (e.g., physically separated IoT devices chartered with the responsibility of water distribution control (e.g., pumps), electricity distribution control (e.g., relays), etc.).

In the illustrated example of FIG. 10, the software distribution platform 1005 includes one or more servers and one or more storage devices. The storage devices store the computer readable instructions 982, which may implement the video synchronization functionality described throughout this disclosure. The one or more servers of the example software distribution platform 1005 are in communication with a network 1010, which may correspond to any one or more of the Internet and/or any of the example networks described throughout this disclosure. In some examples, the one or more servers are responsive to requests to transmit the software to a requesting party as part of a commercial transaction. Payment for the delivery, sale and/or license of the software may be handled by the one or more servers of the software distribution platform and/or via a third-party payment entity. The servers enable purchasers and/or licensors to download the computer readable instructions 982 from the software distribution platform 1005. For example, software comprising the computer readable instructions 982 may be downloaded to the example processor platform(s) 1000 (e.g., example connected edge devices), which is/are to execute the computer readable instructions 982 to implement the functionality described throughout this disclosure. In some examples, one or more servers of the software distribution platform 1005 are communicatively connected to one or more security domains and/or security devices through which requests and transmissions of the example computer readable instructions 982 must pass. In some examples, one or more servers of the software distribution platform 1005 periodically offer, transmit, and/or force updates to the software (e.g., the example computer readable instructions 982 of FIG. 9B) to ensure improvements, patches, updates, etc. are distributed and applied to the software at the end user devices.

In the illustrated example of FIG. 10, the computer readable instructions 982 are stored on storage devices of the software distribution platform 1005 in a particular format. A format of computer readable instructions includes, but is not limited to a particular code language (e.g., Java, JavaScript, Python, C, C#, SQL, HTML, etc.), and/or a particular code state (e.g., uncompiled code (e.g., ASCII), interpreted code, linked code, executable code (e.g., a binary), etc.). In some examples, the computer readable instructions 982 stored in the software distribution platform 1005 are in a first format when transmitted to the example processor platform(s) 1000. In some examples, the first format is an executable binary in which particular types of the processor platform(s) 1000 can execute. However, in some examples, the first format is uncompiled code that requires one or more preparation tasks to transform the first format to a second format to enable execution on the example processor platform(s) 1000. For instance, the receiving processor platform(s) 1000 may need to compile the computer readable instructions 982 in the first format to generate executable code in a second format that is capable of being executed on the processor platform(s) 1000. In still other examples, the first format is interpreted code that, upon reaching the processor platform (s) 1000, is interpreted by an interpreter to facilitate execution of instructions.

In further examples, a machine-readable medium also includes any tangible medium that is capable of storing, encoding or carrying instructions for execution by a machine and that cause the machine to perform any one or more of the methodologies of the present disclosure or that is capable of storing, encoding or carrying data structures utilized by or associated with such instructions. A "machine-readable medium" thus may include but is not limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks. The instructions embodied by a machine-readable medium may further be transmitted or received over a communications network using a transmission medium via a network interface device utilizing any one of a number of transfer protocols (e.g., Hypertext Transfer Protocol (HTTP)).

A machine-readable medium may be provided by a storage device or other apparatus which is capable of hosting data in a non-transitory format. In an example, information stored or otherwise provided on a machine-readable medium may be representative of instructions, such as instructions themselves or a format from which the instructions may be derived. This format from which the instructions may be derived may include source code, encoded instructions (e.g., in compressed or encrypted form), packaged instructions (e.g., split into multiple packages), or the like. The information representative of the instructions in the machine-readable medium may be processed by processing circuitry into the instructions to implement any of the operations discussed herein. For example, deriving the instructions from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions.

In an example, the derivation of the instructions may include assembly, compilation, or interpretation of the information (e.g., by the processing circuitry) to create the instructions from some intermediate or preprocessed format provided by the machine-readable medium. The information, when provided in multiple parts, may be combined, unpacked, and modified to create the instructions. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable, etc.) at a local machine, and executed by the local machine.

Examples

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 includes a system, comprising: a processor; a display controller; a display interface to connect the display controller to a display; and a network interface to connect the system to a network; wherein the processor is to execute instructions that cause the processor to: cause a request to be transmitted over the network to a primary system to obtain a first set of VSYNC timestamps for the primary system; access the first set of VSYNC timestamps received based on the request; access a second set of VSYNC timestamps based on interrupts generated by the display controller; determine an adjustment factor based on a comparison of the first and second VSYNC timestamps; program an adjusted VSYNC period for the display controller based on the determined adjustment factor; and revert back to an original VSYNC period for the display controller after a predetermined number of VSYNC cycles.

Example 2 includes the subject matter of Example 1, wherein the instructions are to cause the processor to program the adjusted VSYNC period for the display controller by modifying values in registers of phased lock loop (PLL) circuitry of the display controller.

Example 3 includes the subject matter of Example 1, wherein the instructions are to determine the number of VSYNC cycles based on the adjustment factor and the original VSYNC period.

Example 4 includes the subject matter of Example 1, wherein the adjustment factor is positive and the adjusted VSYNC period is longer than the original VSYNC period.

Example 5 includes the subject matter of Example 4, wherein the adjustment factor is between 0% and 5%.

Example 6 includes the subject matter of Example 4 or 5, wherein the adjustment factor is between 0.01% and 0.5%.

Example 7 includes the subject matter of Example 1, wherein the adjustment factor is negative and the adjusted VSYNC period is shorter than the original VSYNC period.

Example 8 includes the subject matter of Example 7, wherein the adjustment factor is between 0% and −5%.

Example 9 includes the subject matter of Example 7 or 8, wherein the adjustment factor is between −0.01% and −0.5%.

Example 10 includes the subject matter of any one of Examples 1-9, wherein the display controller is to periodically store a value in a pixel clock register based on an always running timer (ART) value from the processor, and the second set of VSYNC timestamps are based on the pixel clock register values.

Example 11 includes the subject matter of any one of Examples 1-9, wherein the instructions are to obtain timer values from an always running timer (ART) of the processor in response to VSYNC interrupt signals being asserted by the display controller, and the second set of VSYNC timestamps are based on the obtained timer values.

Example 12 includes the subject matter of any one of Examples 1-11, further comprising a display coupled to the display interface.

Example 13 includes one non-transitory machine-readable storage medium having instructions stored thereon, wherein the instructions, when executed on a processing device comprising a display controller, cause the processing device to: access a first set of VSYNC timestamps for a display controller of a first video display device and a second set of VSYNC timestamps for a display controller of a second video display device; determine an adjustment factor based on a comparison of the first and second VSYNC timestamps; program an adjusted VSYNC period for the display controller of the second video display device based on the determined adjustment factor; and revert back to an original VSYNC period for the display controller of the second video display device after a predetermined number of VSYNC cycles.

Example 14 includes the subject matter of Example 13, wherein the instructions are to program the adjusted VSYNC period for the display controller of the second display device by modifying values in registers of phased lock loop (PLL) circuitry of the display controller of the second display device.

Example 15 includes the subject matter of Example 13, wherein the predetermined number of VSYNC cycles is determined based on the adjustment factor and the original VSYNC period.

Example 16 includes the subject matter of Example 13, wherein the adjustment factor is positive and the adjusted VSYNC period is longer than the original VSYNC period.

Example 17 includes the subject matter of Example 16, wherein the adjustment factor is between 0% and 5%.

Example 18 includes the subject matter of Example 16 or 17, wherein the adjustment factor is between 0.01% and 0.5%.

Example 19 includes the subject matter of Example 13, wherein the adjustment factor is negative and the adjusted VSYNC period is shorter than the original VSYNC period.

Example 20 includes the subject matter of Example 19, wherein the adjustment factor is between 0% and −5%.

Example 21 includes the subject matter of Example 19 or 20, wherein the adjustment factor is between −0.01% and −0.5%.

Example 22 includes the subject matter of any one of Examples 13-21, wherein the instructions are further to cause the processing device to obtain the second set of VSYNC timestamps from a display driver of the second video display device that is reading an always running timer (ART) value from a pixel clock register of the display controller.

Example 23 includes the subject matter of any one of Examples 13-21, wherein the instructions are further to cause the processing device to obtain the second set of VSYNC timestamps from a display driver of the second video display device that is requesting an always running timer (ART) value from a processor of the second video display device.

Example 24 includes the subject matter of any one of Examples 13-23, wherein the first set of VSYNC timestamps are obtained based on a request sent to the first video display device by the second video display device.

Example 25 includes a method to synchronize video content displayed across a plurality of display devices, comprising: obtaining a first set of VSYNC timestamps for a display controller of a first video display device and a second set of VSYNC timestamps for a display controller of a second video display device; determining an adjustment factor based on a comparison of the first and second VSYNC timestamps; programming an adjusted VSYNC period for the display controller of the second video display device based on the determined adjustment factor; and reverting back to an original VSYNC period for the display controller of the second video display device after a predetermined number of VSYNC cycles.

Example 26 includes the subject matter of Example 25, wherein programming the adjusted VSYNC period for the display controller of the second display device comprises modifying values in registers of phased lock loop (PLL) circuitry of the display controller of the second display device.

Example 27 includes the subject matter of Example 25, wherein the predetermined number of VSYNC cycles is determined based on the adjustment factor and the original VSYNC period.

Example 28 includes the subject matter of Example 25, wherein the adjustment factor is positive and the adjusted VSYNC period is longer than the original VSYNC period.

Example 29 includes the subject matter of Example 28, wherein the adjustment factor is between 0% and 5%.

Example 30 includes the subject matter of Example 28 or 29, wherein the adjustment factor is between 0.01% and 0.5%.

Example 31 includes the subject matter of Example 25, wherein the adjustment factor is negative and the adjusted VSYNC period is shorter than the original VSYNC period.

Example 32 includes the subject matter of Example 31, wherein the adjustment factor is between −0% and −5%.

Example 33 includes the subject matter of Example 31 or 32, wherein the adjustment factor is between −0.01% and −0.5%.

Example 34 includes the subject matter of any one of Examples 25-33, wherein the second set of VSYNC timestamps are obtained based on a display driver of the second video display device reading an always running timer (ART) value from a pixel clock register of the display controller.

Example 35 includes the subject matter of any one of Examples 25-33, wherein the second set of VSYNC timestamps are obtained based on a display driver of the second video display device requesting an always running timer (ART) value from a processor of the second video display device.

Example 36 includes the subject matter of any one of Examples 25-35, wherein the first set of VSYNC timestamps are obtained based on a request sent to the first video display device by the second video display device.

Example 37 includes an apparatus comprising means to perform the method of any one of Examples 25-36.

Example 38 includes machine-readable storage including machine-readable instructions, when executed, to implement a method or realize an apparatus of any one of Examples 25-37.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

What is claimed is:

1. A system, comprising:
a processor;
a display controller;
a display interface to connect the display controller to a display; and
a network interface to connect the system to a network;
wherein the processor is to execute instructions that cause the processor to:
cause a request to be transmitted over the network to a primary system to obtain a first set of VSYNC timestamps for the primary system;
access the first set of VSYNC timestamps received based on the request;
access a second set of VSYNC timestamps based on interrupts generated by the display controller;
determine an adjustment factor based on a comparison of the first and second VSYNC timestamps;
program an adjusted VSYNC period for the display controller based on the determined adjustment factor; and
revert back to an original VSYNC period for the display controller after a predetermined number of VSYNC cycles.

2. The system of claim 1, wherein the instructions are to cause the processor to program the adjusted VSYNC period for the display controller by modifying values in registers of phased lock loop (PLL) circuitry of the display controller.

3. The system of claim 1, wherein the instructions are to determine the number of VSYNC cycles based on the adjustment factor and the original VSYNC period.

4. The system of claim 1, wherein the adjustment factor is positive and the adjusted VSYNC period is longer than the original VSYNC period.

5. The system of claim 4, wherein the adjustment factor is between 0% and 5%.

6. The system of claim 4, wherein the adjustment factor is between 0.01% and 0.5%.

7. The system of claim 1, wherein the adjustment factor is negative and the adjusted VSYNC period is shorter than the original VSYNC period.

8. The system of claim 7, wherein the adjustment factor is between 0% and −5%.

9. The system of claim 7, wherein the adjustment factor is between −0.01% and −0.5%.

10. The system of claim 1, wherein the display controller is to periodically store a value in a pixel clock register based on an always running timer (ART) value from the processor, and the second set of VSYNC timestamps are based on the pixel clock register values.

11. The system of claim 1, wherein the instructions are to obtain timer values from an always running timer (ART) of the processor in response to VSYNC interrupt signals being asserted by the display controller, and the second set of VSYNC timestamps are based on the obtained timer values.

12. The system of claim 1, further comprising a display coupled to the display interface.

13. At least one non-transitory machine-readable storage medium having instructions stored thereon, wherein the instructions, when executed on a processing device comprising a display controller, cause the processing device to:
access a first set of VSYNC timestamps for a display controller of a first video display device and a second set of VSYNC timestamps for a display controller of a second video display device;
determine an adjustment factor based on a comparison of the first and second VSYNC timestamps;
program an adjusted VSYNC period for the display controller of the second video display device based on the determined adjustment factor; and
revert back to an original VSYNC period for the display controller of the second video display device after a predetermined number of VSYNC cycles.

14. The storage medium of claim 13, wherein the instructions are to program the adjusted VSYNC period for the display controller of the second display device by modifying values in registers of phased lock loop (PLL) circuitry of the display controller of the second display device.

15. The storage medium of claim 13, wherein the predetermined number of VSYNC cycles is determined based on the adjustment factor and the original VSYNC period.

16. The storage medium of claim 13, wherein the adjustment factor is between +/−0.01 and 0.5%.

17. The storage medium of claim 13, wherein the instructions are further to cause the processing device to obtain the second set of VSYNC timestamps from a display driver of the second video display device that is reading an always running timer (ART) value from a pixel clock register of the display controller.

18. The storage medium of claim 13, wherein the instructions are further to cause the processing device to obtain the second set of VSYNC timestamps from a display driver of the second video display device that is requesting an always running timer (ART) value from a processor of the second video display device.

19. The storage medium of claim 13, wherein the first set of VSYNC timestamps are obtained based on a request sent to the first video display device by the second video display device.

20. A method to synchronize video content displayed across a plurality of display devices, comprising:
obtaining a first set of VSYNC timestamps for a display controller of a first video display device and a second set of VSYNC timestamps for a display controller of a second video display device;

determining an adjustment factor based on a comparison of the first and second VSYNC timestamps;

programming an adjusted VSYNC period for the display controller of the second video display device based on the determined adjustment factor; and reverting back to an original VSYNC period for the display controller of the second video display device after a predetermined number of VSYNC cycles.

21. The method of claim 20, wherein programming the adjusted VSYNC period for the display controller of the second display device comprises modifying values in registers of phased lock loop (PLL) circuitry of the display controller of the second display device.

22. The method of claim 20, wherein the predetermined number of VSYNC cycles is determined based on the adjustment factor and the original VSYNC period.

23. The method of claim 20, wherein the second set of VSYNC timestamps are obtained based on a display driver of the second video display device reading an always running timer (ART) value from a pixel clock register of the display controller.

24. The method of claim 20, wherein the second set of VSYNC timestamps are obtained based on a display driver of the second video display device requesting an always running timer (ART) value from a processor of the second video display device.

25. The method of claim 20, wherein the first set of VSYNC timestamps are obtained based on a request sent to the first video display device by the second video display device.

* * * * *